United States Patent
Takahashi et al.

(10) Patent No.: US 11,839,131 B2
(45) Date of Patent: Dec. 5, 2023

(54) SEMICONDUCTOR DEVICE, DISPLAY APPARATUS, IMAGING APPARATUS, ELECTRONIC APPARATUS, ILLUMINATION APPARATUS, MOVING OBJECT, AND PHOTOELECTRIC CONVERSION APPARATUS

(71) Applicant: CANON KABUSHIKI KAISHA, Tokyo (JP)

(72) Inventors: Tetsuo Takahashi, Kawasaki (JP); Hiroaki Sano, Yokohama (JP); Daisuke Okabayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 391 days.

(21) Appl. No.: 17/002,565

(22) Filed: Aug. 25, 2020

(65) Prior Publication Data

US 2021/0066411 A1 Mar. 4, 2021

(30) Foreign Application Priority Data

Aug. 30, 2019 (JP) ................................ 2019-158970

(51) Int. Cl.
*H10K 59/65* (2023.01)
*H10K 50/856* (2023.01)
*H10K 59/38* (2023.01)

(52) U.S. Cl.
CPC ........... *H10K 59/65* (2023.02); *H10K 50/856* (2023.02); *H10K 59/38* (2023.02)

(58) Field of Classification Search
CPC .......................... H01L 27/3246; H10K 59/122
See application file for complete search history.

(56) References Cited

U.S. PATENT DOCUMENTS

| 10,879,316 B2 * | 12/2020 | Lee ........................ H10K 50/15 |
| 2004/0119419 A1 * | 6/2004 | Kai ....................... H10K 59/122 |
| | | 315/169.3 |
| 2006/0158107 A1 * | 7/2006 | Kai ..................... H01L 27/3246 |
| | | 313/504 |
| 2007/0194322 A1 | 8/2007 | Sung et al. |

(Continued)

FOREIGN PATENT DOCUMENTS

| CN | 109216420 A | 1/2019 |
| JP | 2007096277 A | 4/2007 |

(Continued)

*Primary Examiner* — Alia Sabur
(74) *Attorney, Agent, or Firm* — Canon U.S.A., Inc. IP Division

(57) ABSTRACT

A semiconductor device comprises an electrode on a substrate, an insulating layer covering an edge of the electrode and disposed on the substrate, and an organic layer comprising a charge transport layer on the electrode and insulating layer and a functional layer, wherein the insulating layer has a first portion forming an angle of 0° to 50° with respect to a surface parallel to a lower surface of the electrode, a second portion located closer to the substrate than the first portion and sloping at more than 50°, and a third portion located closer to the organic layer than the first portion and sloping at more than 50°, wherein a length of the third portion in a direction perpendicular to the parallel surface is larger than a thickness of the charge transport layer at a position in contact with the electrode.

30 Claims, 14 Drawing Sheets

(56) References Cited

U.S. PATENT DOCUMENTS

| | | | | |
|---|---|---|---|---|
| 2012/0248467 A1* | 10/2012 | Yokoyama | ............ | H01L 27/3272 257/E51.018 |
| 2012/0326201 A1* | 12/2012 | Ohnuma | .............. | H10K 59/122 438/22 |
| 2013/0032832 A1* | 2/2013 | Ishii | .................... | H01L 27/1248 257/E21.409 |
| 2015/0162391 A1* | 6/2015 | Kim | .................... | H10K 59/122 257/40 |
| 2016/0043161 A1* | 2/2016 | Miyazawa | ......... | H10K 59/1315 257/40 |
| 2017/0044308 A1* | 2/2017 | Funyuu | .................. | C08G 61/12 |
| 2017/0062528 A1 | 3/2017 | Aoyama | | |
| 2017/0141165 A1 | 5/2017 | Lv et al. | | |
| 2017/0250236 A1 | 8/2017 | Xiong et al. | | |
| 2017/0373124 A1 | 12/2017 | Yang et al. | | |
| 2018/0151830 A1* | 5/2018 | Furuta | ................. | H10K 59/123 |
| 2019/0165059 A1* | 5/2019 | Hou | ........................ | H01L 27/12 |
| 2020/0043996 A1* | 2/2020 | Cheng | ................ | H10K 59/124 |
| 2020/0066815 A1* | 2/2020 | Choi | .................... | H10K 59/131 |
| 2020/0152717 A1* | 5/2020 | Hwang | .................. | H10K 59/38 |
| 2020/0279896 A1* | 9/2020 | Cao | ...................... | H10K 59/173 |
| 2021/0273025 A1* | 9/2021 | Aoyama | ............. | H10K 50/865 |

FOREIGN PATENT DOCUMENTS

| | | | |
|---|---|---|---|
| JP | 2008226849 | A | 9/2008 |
| JP | 2012216495 | A | 11/2012 |
| JP | 2015046239 | A | 3/2015 |
| JP | 2017142975 | A | 8/2017 |
| JP | 2017227858 | A | 12/2017 |

\* cited by examiner

SEMICONDUCTOR DEVICE, DISPLAY APPARATUS, IMAGING APPARATUS, ELECTRONIC APPARATUS, ILLUMINATION APPARATUS, MOVING OBJECT, AND PHOTOELECTRIC CONVERSION APPARATUS

BACKGROUND

Field of the Disclosure

The present disclosure relates to a semiconductor device, a display apparatus, an imaging apparatus, an electronic apparatus, an illumination apparatus, a moving object, and a photoelectric conversion apparatus.

Description of the Related Art

As devices comprising organic layers, semiconductor devices including light-emitting elements or photoelectric conversion elements have been proposed. Light-emitting elements are elements that include an upper electrode, a lower electrode, and an organic layer disposed between the electrodes and emit light when an organic compound included in the organic layer is excited. In recent years, devices including organic light-emitting elements have attracted attention.

In a semiconductor device comprising organic light-emitting elements, a plurality of light-emitting elements have a common organic layer in some cases. In such a structure, a current tends to leak through the organic layer between adjacent light-emitting elements. The leakage current between light-emitting elements may cause unintended light emission from light-emitting elements. For example, when a semiconductor device is used in a display apparatus, such unintended light emission from light-emitting elements may reduce the color gamut, which represents the display performance of the display apparatus. Furthermore, in a single light-emitting element, the leakage current may cause unintended light emission when light is desired to be emitted from a partial region of an organic layer that continuously extends.

In a photoelectric conversion element comprising an organic layer, an organic photoelectric conversion layer may be continuously disposed so as to cover a plurality of lower electrodes. In this case, a leakage current may flow between the plurality of lower electrodes through the organic layer, which may cause a noise.

Japanese Patent Laid-Open No. 2012-216495 discloses a light-emitting element in which an inner wall surface of an insulating layer has a corner portion to thereby reduce a leakage current, and the insulating layer has a surface having a small slope angle to thereby suppress disconnection of an upper electrode.

In Japanese Patent Laid-Open No. 2012-216495, there is no study on the relationship between the thickness of an organic layer and the shape of the insulating layer or the relationship between the thickness of a charge transport layer, which is mainly a cause of a leakage current, and the shape of the insulating layer. Accordingly, a reduction in the leakage current between lower electrodes may be insufficient depending on the thickness of the organic layer. As described above, light-emitting characteristics are degraded by unintended light emission in the related art.

SUMMARY

The present disclosure has been made in view of the problem described above. The present disclosure provides a semiconductor device in which a leakage current from an electrode is reduced.

According to some embodiments, a semiconductor device comprising: a first electrode disposed on a substrate; an insulating layer covering an edge of the first electrode and disposed on the substrate; an organic layer that comprises a charge transport layer disposed on the first electrode and the insulating layer and a functional layer disposed on the charge transport layer; and a second electrode disposed on the organic layer, wherein, in a section passing through the substrate, the insulating layer, and the organic layer, the insulating layer has a first portion having a surface that forms an angle of 0° or more and 50° or less with respect to a parallel surface parallel to a lower surface of the first electrode, a second portion located closer to the substrate than the first portion and having a surface that slopes at an angle of more than 50° with respect to the parallel surface, and a third portion located farther away from the substrate than the first portion and having a surface that slopes at an angle of more than 50° with respect to the parallel surface, and in the section, a length of the third portion in a direction perpendicular to the parallel surface is larger than a thickness of the charge transport layer at a position at which the first electrode and the charge transport layer are in contact with each other in the section, is provided.

Further features of the present disclosure will become apparent from the following description of exemplary embodiments with reference to the attached drawings.

DESCRIPTION OF THE EMBODIMENTS

A semiconductor device according to an embodiment may be an organic light-emitting device. When the semiconductor device is an organic light-emitting device, a functional layer may include, for example, a light-emitting layer. Alternatively, a semiconductor device according to an embodiment may be a photoelectric conversion device. When the semiconductor device is a photoelectric conversion device, a functional layer may include, for example, a photoelectric conversion layer.

Hereafter, specific examples of a semiconductor device according to an embodiment of the present disclosure will be described with reference to the attached drawings. In the following descriptions and drawings, components that are common among a plurality of drawings are denoted by the same reference signs. Therefore, common components will be described with reference to the plurality of drawings, and descriptions of the components denoted by the same reference signs will be appropriately omitted.

First Embodiment

Figure 1:
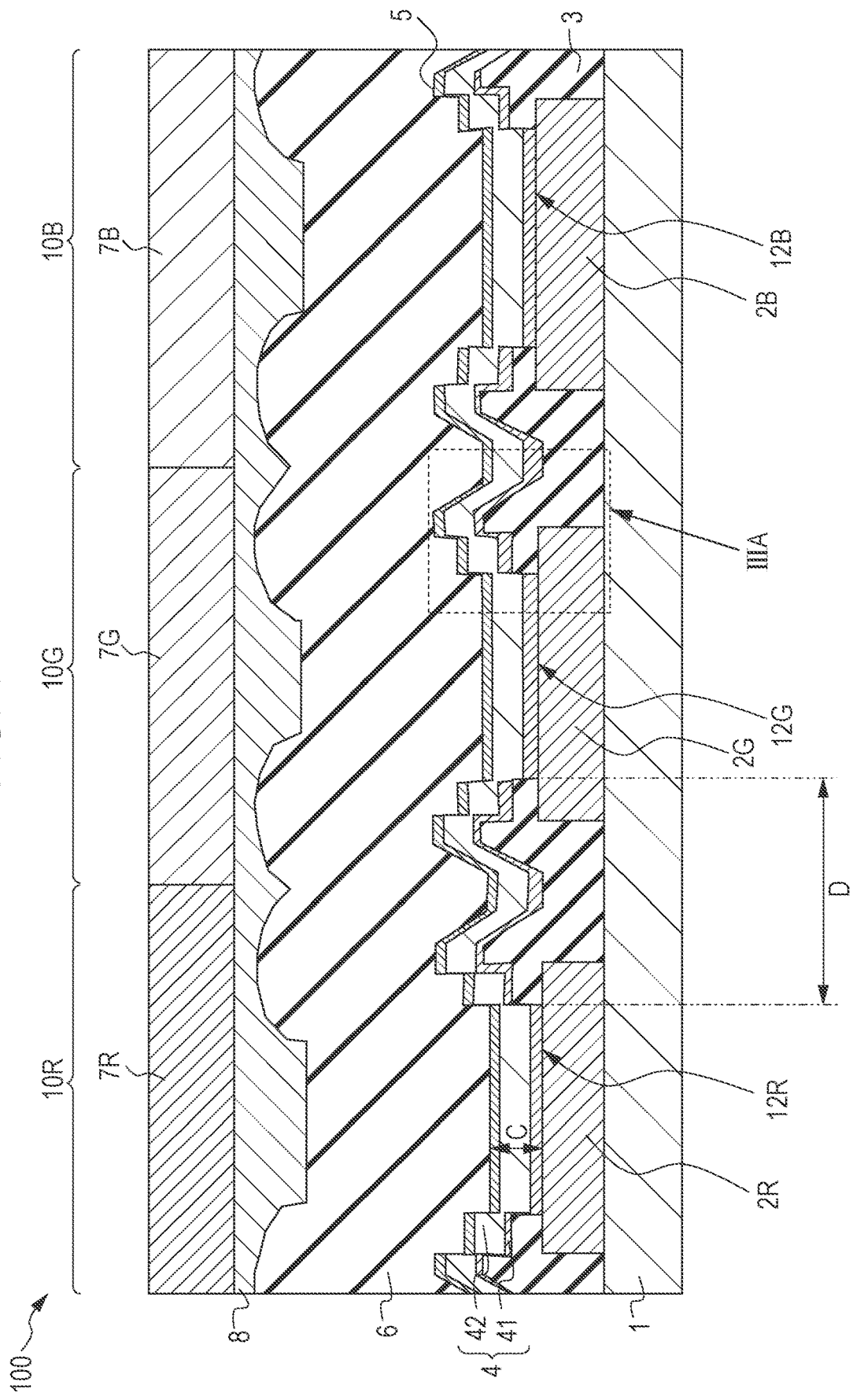
FIG. 1 is a schematic sectional view illustrating the structure of a part of a light-emitting device according to an embodiment.
Figure 2:
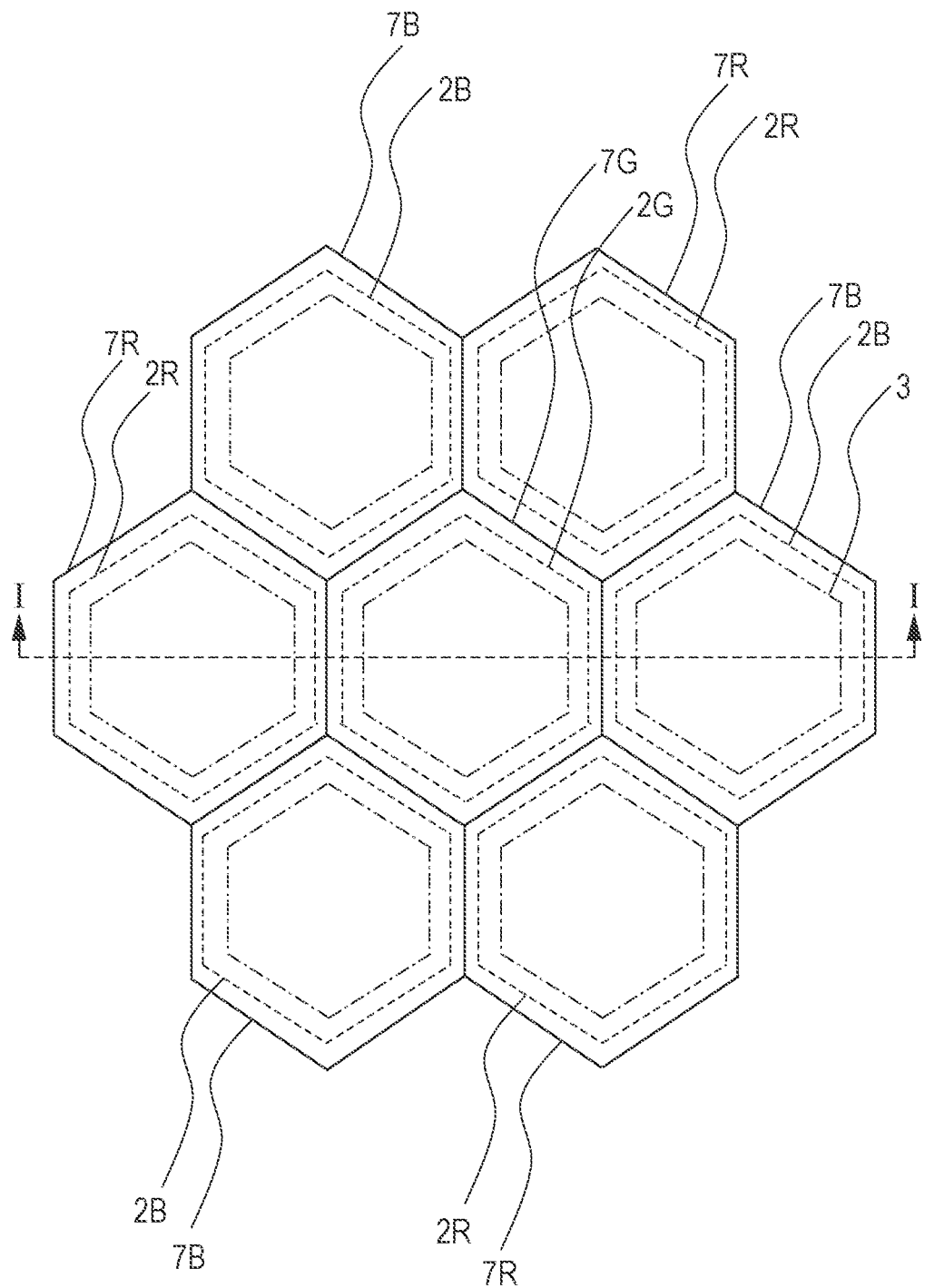
FIG. 2 is a schematic plan view illustrating the structure of a part of the light-emitting device in FIG. 1.

In a first embodiment, a description will be made of an example in which the semiconductor device is a light-emitting device. FIG. 1 is a schematic sectional view of a part of a light-emitting device 100 according to the first embodiment. FIG. 2 is a top view of a part of the light-emitting device 100. A section taken along line I-I in FIG. 2 corresponds to FIG. 1. The figures illustrate an example in which three elements 10 constitute a single pixel. In this embodiment, an example of pixels in a delta array will be described. The array is not limited thereto and may be a stripe array or a square array.

The light-emitting device 100 comprises an element substrate 1 and a plurality of light-emitting elements 10 disposed on the element substrate 1. FIG. 1 illustrates, among the plurality of light-emitting elements 10 included in the light-emitting device 100, three light-emitting elements 10R, 10G, and 10B. The symbol "R" in 10R means that the element is configured to emit red light. Similarly, 10G and 10B represent elements configured to emit green light and blue light, respectively. In the present specification, in the case where, among the plurality of light-emitting elements 10, a specific light-emitting element is referred to, the reference number 10 is suffixed with a reference sign, for example, a light-emitting element 10"R"; alternatively, in the case where any light-emitting element is referred to, the element is simply referred to as a light-emitting element "10". The same applies to other components.

The semiconductor device comprises lower electrodes 2 disposed on the element substrate 1, an insulating layer 3 covering edges of the lower electrodes 2 and disposed on the element substrate 1, an organic layer 4 that includes a light-emitting layer covering the lower electrodes 2 and the insulating layer 3, and an upper electrode 5 covering the organic layer 4. The lower electrodes 2 are separated by the insulating layer 3 so as to correspond to the light-emitting elements. The organic layer 4 includes a charge transport layer 41 disposed so as to be in contact with the lower electrodes 2 and the insulating layer 3, and a functional layer 42 disposed on the charge transport layer 41.

An example in which the semiconductor device is a light-emitting device 100 will be described in more detail. The light-emitting device 100 is an example of a top emission device configured to extract light from the upper electrode 5. Accordingly, the functional layer includes, for example, a light-emitting layer. The semiconductor device may include a protective layer 6 disposed so as to cover the upper electrode 5, and a plurality of color filters 7 disposed on the protective layer 6 so as to correspond to the plurality of light-emitting elements 10.

When the semiconductor device is a photoelectric conversion device, the functional layer includes a photoelectric conversion layer.

In this embodiment, the organic layer 4 emits white light, and color filters 7R, 7G, and 7B separate, from the white light emitted from the organic layer 4, GB light components, respectively. Alternatively, the color filters may be color conversion layers configured to absorb light emitted from the organic layer and convert the color of the light to other colors.

In the present specification, the terms "upper" and "lower" respectively denote upper and lower in FIG. 1. Of the main surfaces of the element substrate 1, a surface on which the lower electrodes 2 and other components are disposed is referred to as an upper surface of the element substrate 1. A surface of each of the lower electrodes 2 adjacent to the element substrate 1 is referred to as a lower surface of the lower electrode 2. Herein, the lower surface of the lower electrode 2 refers to a surface that is in contact with an interlayer insulating layer on the uppermost surface of the element substrate 1. Accordingly, when, for example, a plug for connecting to another wiring is connected to the lower surface of the lower electrode 2, a substantially planar portion except for the portion of the plug is referred to as the lower surface.

The term "height" basically refers to a distance determined upward from the upper surface (first surface) of the element substrate 1. Alternatively, a portion parallel to the upper surface (first surface) of the element substrate 1 is specified, and the "height" may be defined on the basis of the specified reference.

In FIG. 1, although not shown, the element substrate 1 may have a driving circuit including transistors, wiring, and plugs that are connected to the lower electrodes 2 and an interlayer insulating layer and has an interlayer insulating layer on the uppermost surface thereof (surface in contact with the lower electrodes 2). The interlayer insulating layer may include, for example, an inorganic substance such as silicon oxide or silicon nitride or an organic substance such as polyimide or polyacrylate. The organic layer such as the functional layer may be degraded by water. Accordingly, from the viewpoint of suppressing entry of water, the interlayer insulating layer may be formed of an inorganic material. The interlayer insulating layer may also be referred to as a planarization layer because the interlayer insulating layer is provided in order to reduce irregularities of the surface on which the lower electrodes 2 are to be formed.

The lower electrodes 2 may be made of a metal material having a reflectance of 80% or more for the emission wavelength of the organic layer 4. For example, the lower electrodes 2 may be made of a metal such as Al or Ag, or an alloy in Which, for example, Si, Cu, Ni, or Nd is added to the above metal. Herein, the term "emission wavelength" means the spectral range of light emitted from the organic layer 4. The lower electrodes 2 may have a multilayer structure including a barrier layer as long as the lower electrodes 2 have a high reflectance for the emission wavelength of the organic layer 4. The material of the barrier layer may be a metal such as Ti, W, Mo, or Au or an alloy thereof. The barrier layer may be a metal layer disposed on the upper surfaces of the lower electrodes 2.

The insulating layer 3 may be disposed between each of the lower electrodes 2 and the organic layer 4 so as to cover edges of the lower electrodes 2. The lower electrodes 2 may each include a first region covered with the insulating layer 3 and a second region that is not covered with the insulating layer 3 but is covered with the organic layer 4. In other words, the second region is in contact with the organic layer 4, i.e., the charge transport layer 41 in this embodiment. The second region overlaps an opening 12 of the insulating layer 3 in the plan view with respect to the lower surface of the lower electrode 2. The second region serves as a light emission area of each of the light-emitting elements 10.

That is, the shape of the light emission area may be a shape defined by the opening of the insulating layer 3, when viewed from the top. The insulating layer 3 is not limited to the shape illustrated in FIG. 1 as long as the insulating layer 3 has a function of separating the lower electrodes 2 of the light-emitting elements 10 and a function of defining the light emission area.

In the section illustrated in FIG. 1, which is a section passing through the element substrate 1, the insulating layer 3, and the organic layer 4, the insulating layer 3 has two portions that are steeply sloped and a portion that is gently sloped between the two portions. With this structure, the thickness of the organic layer 4 disposed on the insulating layer 3 can be controlled to an appropriate range. The details will be described later with reference to FIG. 3A.

The insulating layer 3 may be formed by, for example, chemical vapor deposition (CVD) or physical vapor deposition (PVD). The insulating layer 3 may be formed of, for example, silicon nitride (SiN), silicon oxynitride (SiON), or silicon oxide (SiO). The insulating layer 3 may be a stack of films formed of such materials. The slope angle of the slope portion of the insulating layer may be controlled by adjusting conditions for anisotropic etching or isotropic etching.

The slope angle of the insulating layer 3 may be controlled by adjusting the slope angle of a layer immediately below the insulating layer 3. For example, a recess having a sloped side surface may be formed in an interlayer insulating layer on the uppermost surface of the element substrate 1, and the angle of the slope may be adjusted. Thus, the slope angle of the slope portion of the insulating layer 3 can be adjusted. The insulating layer 3 may have, in the upper surface thereof, irregularities formed by, for example, processing such as etching or further stacking another layer.

The organic layer 4 is disposed between the lower electrode 2 and the upper electrode 5 and between the insulating layer 3 and the upper electrode 5. The organic layer 4 may be continuously formed on the upper surface of the element substrate 1 and shared by the plurality of light-emitting elements 10. Specifically, a single organic layer 4 may be shared by a plurality of light-emitting elements. The organic layer 4 may be formed as a single layer over the entire surface of a display area for displaying an image in the light-emitting device 100.

The organic layer 4 may include a hole transport layer, a light-emitting layer, and an electron transport layer. The materials of the organic layer 4 can be appropriately selected in view of light emission efficiency, operating lifetime, or optical interference. The hole transport layer may also function as an electron blocking layer or a hole injection layer. The hole transport layer may have a multilayer structure of, for example, a hole injection layer, a hole transport layer, and an electron blocking layer. The light-emitting layer may have a multilayer structure of light-emitting layers configured to emit light of different colors. Alternatively, the light-emitting layer may be a mixture layer including a mixture of light-emitting dopants configured to emit light of different colors. The electron transport layer may also function as a hole blocking layer or an electron injection layer. The electron transport layer may have a multilayer structure of an electron injection layer, an electron transport layer, and a hole blocking layer.

A region between the light-emitting layer and one electrode functioning as an anode, the one electrode being one of the upper electrode 5 and the lower electrode 2, serves as a hole transport layer. A region between the light-emitting layer and the other electrode functioning as a cathode serves as an electron transport layer. The hole transport layer and the electron transport layer are collectively referred to as a charge transport layer. In the case of a photoelectric conversion element, a region between a photoelectric conversion layer and an anode or a cathode serves as a charge transport layer.

The layer that is in contact with the lower electrode 2 may be the hole transport layer. When the hole transport layer has a higher mobility than the electron transport layer, a leakage current between the lower electrodes 2 tends to flow. Thus, the advantage of this embodiment can be more significantly exhibited.

The upper electrode 5 is disposed on the organic layer 4. The upper electrode 5 is continuously formed over the plurality of light-emitting elements 10 and is shared by the plurality of the light-emitting elements 10. As in the organic layer 4, the upper electrode 5 may also be formed as a single layer over the entire surface of the display area for displaying an image in the light-emitting device 100. The upper electrode 5 may be an electrode that transmits at least a portion of light that has reached the lower surface of the upper electrode 5. The upper electrode 5 may function as a semi-transmissive reflective layer that transmits one portion of light and reflects the other portion (i.e., that has semi-transmissive reflectivity).

The upper electrode 5 may be formed of, for example, a metal such as magnesium or silver, an alloy including magnesium or silver as a main component, or an alloy material including an alkali metal or an alkaline earth metal. Alternatively, the upper electrode 5 may be formed of for example, an oxide conductor. The upper electrode 5 may have a multilayer structure as long as the upper electrode 5 has an appropriate transmittance.

The protective layer 6 may be formed of, for example, a material having a low permeability of oxygen and water from the outside, such as silicon nitride, silicon oxynitride, aluminum oxide, silicon oxide, or titanium oxide. The silicon nitride and silicon oxynitride may be formed by, for example, chemical vapor deposition (CVD). On the other hand, the aluminum oxide, silicon oxide, and titanium oxide can be formed by atomic layer deposition (ALD).

The combination of the material and the production method for the protective layer is not limited to the examples described above. The protective layer may be produced in consideration of, for example, the thickness of the layer to be formed, and the time necessary for the formation. The protective layer 6 may have a single-layer structure or a multilayer structure as long as the protective layer 6 transmits light which has passed through the upper electrode 5 and has sufficient moisture barrier performance.

The color filters 7 are formed on the protective layer 6. The color filters 7 may be in contact with each other without gaps, such as the color filter 7R and the color filter 7G illustrated in FIG. 1. Alternatively, a color filter may be disposed so as to overlap a color filter of another color.

The relationship between the insulating layer 3 and the organic layer 4 of the semiconductor device according to this embodiment will be described with reference to FIG. 3A.

Figure 3A:
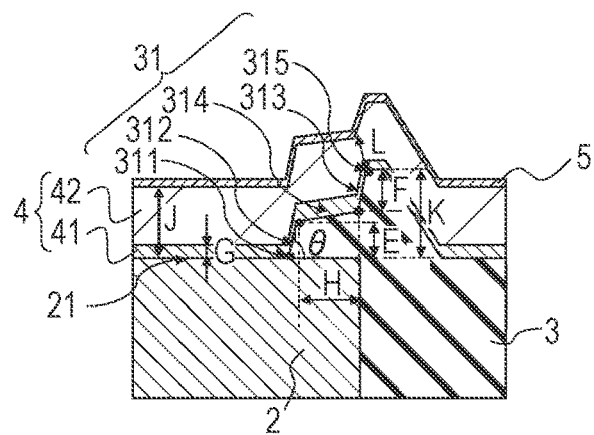
FIG. 3A to FIG. 3D are each an enlarged view of a schematic sectional view illustrating the structure of a part of a light-emitting device according to an embodiment.

FIG. 3A is an enlarged view of the dotted line portion IIIA in FIG. 1. FIG. 3A illustrates the details of a slope portion 31 of an insulating layer 3. In a section passing through an element substrate 1, an insulating layer 3, and an organic layer 4, the insulating layer 3 has a slope portion 31. In the section, the slope portion 31 has, between a lower end 311 and an upper end 315 of the slope portion 31, a gentle slope portion 314, and a steep slope portion 312 and a steep slope portion 313 that sandwich the gentle slope portion 314.

The gentle slope portion 314 has a surface that slopes at 0° or more and 50° or less with respect to a parallel surface parallel to the lower surface of the lower electrode 2. In other words, the angle between the surface of the gentle slope portion 314 and the parallel surface parallel to the lower surface of the lower electrode 2 is within the range of 0° or more and 50° or less. In the present specification, when two surfaces are parallel to each other, the angle between the two surfaces is defined as 0°. The steep slope portion 312 is located lower (closer to the element substrate) than the gentle slope portion 314 and has a surface that slopes at a slope angle θ of more than 50° with respect to the parallel surface. The steep slope portion 313 is located closer to the organic layer 4 (farther away from the element substrate 1) than the gentle slope portion 314 and has a surface that slopes at a slope angle of more than 50° with respect to the parallel surface.

Here, a description will be made of an example in which the surface of the steep slope portion 312 and the surface of the steep slope portion 313 slope at more than 50° and 90° or less with respect to the parallel surface.

FIG. 3A illustrates an example in which the steep slope portion 312, the steep slope portion 313, and the gentle slope portion 314 each have a constant slope angle. Alternatively, the slope angle may vary depending on points of each of the slope portions. For example, in the case where the slope angle continuously varies from the steep slope portion 312 toward the gentle slope portion 314, a point at Which the slope angle is 50° is the boundary between the steep slope portion 312 and the gentle slope portion 314.

In this embodiment, the lower electrode 2 has, on the upper surface thereof, a contact portion 21 that is in contact with the organic layer 4. FIG. 3A illustrates an example in which the contact portion 21 is uniformly flat. Alternatively, a portion of the lower electrode 2 may be removed along a side surface of the insulating layer 3 so that the contact portion 21 has a non-flat portion. The term "flat portion" refers to a portion that is substantially parallel to the element substrate 1 and is a portion having a slope angle of 0°. The term "thickness of the organic layer 4 or the charge transport layer 41 at a position in contact with the lower electrode 2" refers to a length of the organic layer 4 or the charge transport layer 41 on the flat portion of the upper surface of the lower electrode 2 in a direction perpendicular to a surface parallel to the lower surface of the lower electrode 2 (hereinafter, also referred to as a "perpendicular direction").

Since the slope portion 31 of the insulating layer 3 has the steep slope portions 312 and 313 having surfaces that slope at more than 50° and 90° or less with respect to the surface parallel to the lower surface of the lower electrode 2, the thickness of the charge transport layer 41 can be reduced. On the other hand, since the slope portion 31 of the insulating layer 3 has the gentle slope portion 314 having a surface that forms an angle of 0° or more and 50° or less with respect to the parallel surface, it is possible to reduce the flow of the leakage current between the upper electrode 5 and the lower electrode 2 due to an excessively small thickness of the charge transport layer 41. However, in some cases, the leakage current cannot be sufficiently reduced merely by providing the steep slope portions 312 and 313 and the gentle slope portion 314 in the insulating layer 3.

In this embodiment, a length F of the steep slope portion 313 in a direction perpendicular to a surface parallel to the lower surface of the lower electrode 2 is larger than a thickness G of the charge transport layer 41 at a position at which the charge transport layer 41 is in contact with the lower electrode 2. When the thickness G of the charge transport layer 41 is larger than the length F of the steep slope portion 313, the steep slope portion 313 is embedded in the charge transport layer 41, and the thickness of the charge transport layer 41 on the steep slope portion 313 is not sufficiently reduced in some cases. In such a case, the leakage current may flow between adjacent lower electrodes 2 because the charge transport layer 41 has a high charge transport capability.

In contrast, as illustrated in FIG. 3A, since the length F of the steep slope portion 313 in the direction perpendicular to the surface parallel to the lower surface of the lower electrode 2 is larger than the thickness G of the charge transport layer 41 at a position in contact with the lower electrode 2, the thickness of the charge transport layer 41 is easily reduced along the steep slope portion 313. Accordingly, the thickness of the charge transport layer 41 in a direction perpendicular to the surface of the steep slope portion 313 can be reduced. Thus, the leakage current can be more effectively reduced between adjacent lower electrodes 2.

In addition, a length E of the steep slope portion 312 in the direction perpendicular to the surface parallel to the lower surface of the lower electrode 2 is larger than the thickness G of the charge transport layer 41 at a position at which the charge transport layer 41 is in contact with the lower electrode 2. With this structure, the leakage current can be still more effectively reduced between adjacent lower electrodes 2.

In this embodiment, a description has been made of an example in which the slope portion 31 of the insulating layer 3 has two steep slope portions, namely, the steep slope portion 312 and the steep slope portion 313, and a gentle slope portion between the two steep slope portions. Alternatively, the slope portion 31 may have a larger number of steep slope portions or a larger number of gentle slope portions.

Figure 3B:
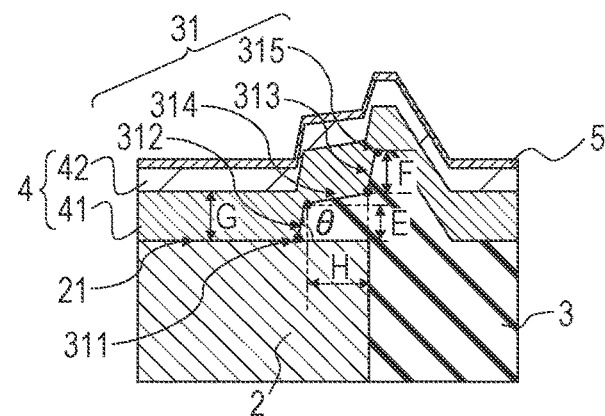

FIG. 3B illustrates, as a comparative example, a case where the length E of the steep slope portion 312 in the perpendicular direction and the length F of the steep slope portion 313 in the perpendicular direction are smaller than the thickness G of the charge transport layer 41 at a position in contact with the lower electrode 2. Unlike the structure illustrated in FIG. 3A, since the steep slope portion 312 is embedded in the charge transport layer 41 deposited on the lower electrode 2, a portion of the charge transport layer 41 having a small layer thickness is unlikely to be formed along the steep slope portion 312. Similarly, since the steep slope portion 313 is also embedded in the charge transport layer 41 deposited on the gentle slope portion 314, a portion of the charge transport layer 41 having a small layer thickness is unlikely to be formed. Accordingly, the leakage current between the lower electrodes 2 is unlikely to be reduced.

Figure 3C:
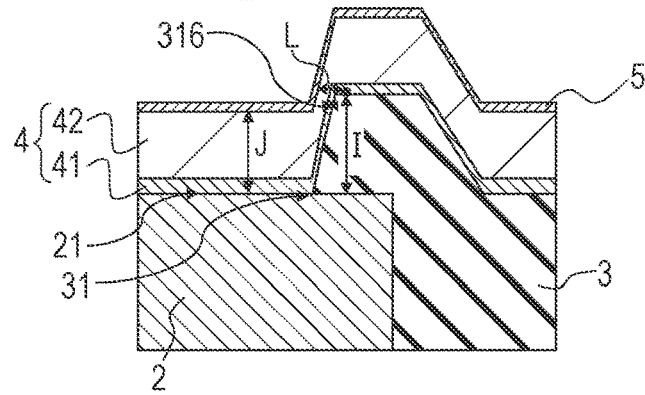

FIG. 3C illustrates, as a comparative example, a case where the gentle slope portion 314 in FIG. 3A is removed, and a large, single steep slope portion 316 is provided. In this case, a portion of the organic layer 4 having a small layer thickness can be formed by the steep slope portion 316. However, with an increase in a length I of the steep slope portion 316 in the perpendicular direction, a length L of the steep slope portion 316 in the horizontal direction tends to be smaller than a layer thickness J of a portion of the organic layer 4, the portion being in contact with the lower electrode 2. Consequently, the thickness of the organic layer 4 tends to decrease along the steep slope portion 316. Therefore, the leakage current between the upper electrode 5 and the lower electrode 2 tends to flow.

On the other hand, when the length I of the steep slope portion 316 in FIG. 3C in the perpendicular direction is reduced, a portion of the organic layer 4 having a small layer thickness is unlikely to be formed. Consequently, it is difficult to reduce the leakage current between the lower electrodes 2.

As illustrated in FIG. 3A, a thickness J of the portion of the organic layer 4, the portion being in contact with the lower electrode 2, may be larger than the length E of the steep slope portion 312 in the perpendicular direction and the length F of the steep slope portion 313 in the perpendicular direction. With this structure, the steep slope portion 312 and the steep slope portion 313 are each embedded in the organic layer 4. Accordingly, thin portions of the organic layer 4 along the steep slope portion 312 and the steep slope portion 313 are unlikely to be formed, and a thin portion of the organic layer 4 is unlikely to be formed. Therefore, the leakage current between the upper electrode 5 and the lower electrode 2 is easily reduced.

In addition, the length E of the steep slope portion 312 in the perpendicular direction and the length F of the steep slope portion 313 in the perpendicular direction may be larger than 1.4 times the thickness G of the charge transport layer 41 at a position in contact with the lower electrode 2. With this structure, the thin portions of the charge transport layer 41 along the steep slope portion 312 and the steep slope portion 313, the thin portions being illustrated in FIG. 3A, can be formed as thinner portions. Therefore, the leakage current between the lower electrodes 2 can be reduced.

As illustrated in FIG. 3A, a length H of the surface of the gentle slope portion 314 in a direction parallel to the lower surface of the lower electrode 2 (hereinafter, also referred to as a "parallel direction") may be larger than the length F of the steep slope portion 313 in the perpendicular direction. With this structure, the organic layer 4 is unlikely to have a portion having an excessively small layer thickness. Thus, the leakage current between the upper electrode 5 and the lower electrode 2 is easily reduced.

Figure 3D:
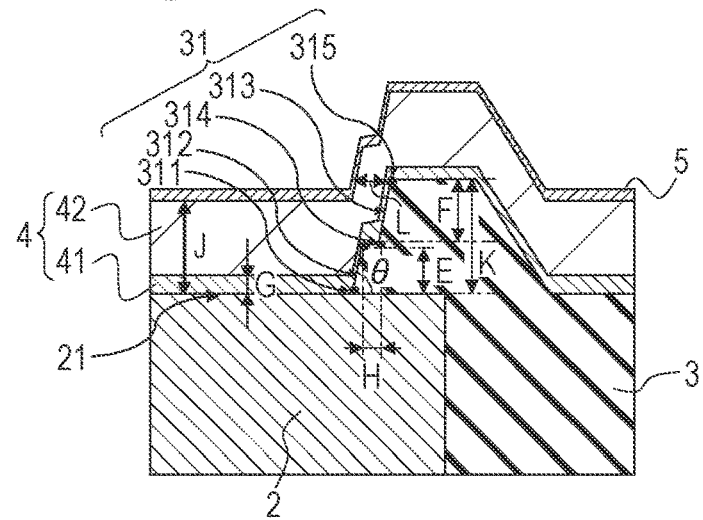

In contrast, as a form different from the present embodiment, FIG. 3D illustrates a part of a light-emitting device in which the distance H of the surface of the gentle slope portion 314 in the parallel direction is smaller than the length F of the steep slope portion 313 in the perpendicular direction. In this case, since a minimum thickness distance L of the organic layer 4 is the distance in the parallel direction, the organic layer 4 tends to have a portion having a small layer thickness compared with the structure illustrated in FIG. 3A. However, the light-emitting device illustrated in FIG. 3D also includes two-stage steep slope portions, namely, the steep slope portion 312 and the steep slope portion 313, and the gentle slope portion 314 between the two steep slope portions. Accordingly, the organic layer 4 is unlikely to have a portion having an excessively small layer thickness compared with the case where the large, single steep slope portion illustrated in FIG. 3C is provided.

As illustrated in FIG. 3A, a slope portion that forms an opening of the insulating layer 3 may have the steep slope portion 312, the steep slope portion 313, and the gentle slope portion 314. The reason for this is as follows. Since a large amount of current flows near the opening of the insulating layer 3, the leakage current between the upper electrode 5 and the lower electrode 2 tends to flow, and the layer thickness of the organic layer 4 cannot be significantly reduced. Thus, the advantages of the present embodiment are easily achieved.

As illustrated in FIG. 3A, the thickness J of the organic layer 4 at a position in contact with the lower electrode 2 may be smaller than a sum K of the lengths of the steep slope portions 312 and 313 and the gentle slope portion 314 in the direction perpendicular to the lower surface of the lower electrode 2. With this structure, the thickness of the organic layer 4 can be reduced, and the leakage current between the lower electrodes 2 can be reduced. On the other hand, with the decrease in the thickness of the organic layer 4, the leakage current between the upper electrode 5 and the lower electrode 2 is more likely to flow. However, since the gentle slope portion 314 is provided between the steep slope portions 312 and 313, the thickness of organic layer 4 is not excessively reduced, and the leakage current between the upper electrode 5 and the lower electrode 2 can be reduced.

The two-stage steep slope portions 312 and 313 as illustrated in FIG. 3A can be formed by, for example, depositing an insulating film, and subsequently performing etching twice in different areas.

Next, a structure that more significantly provides the advantages of the present embodiment will be described with reference to FIG. 4 and FIG. 5.

Figure 4:
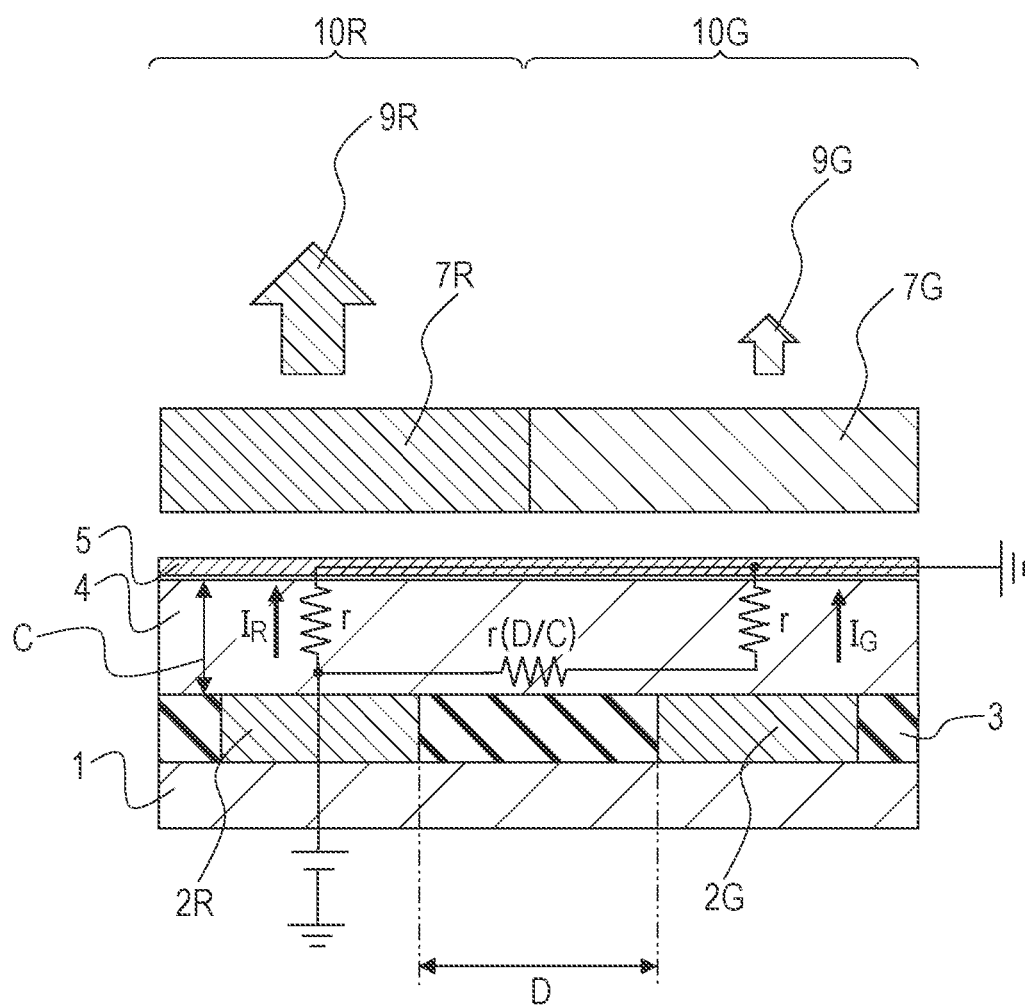
FIG. 4 includes a schematic view and a circuit diagram of a part of a light-emitting device according to an embodiment.
Figure 5:
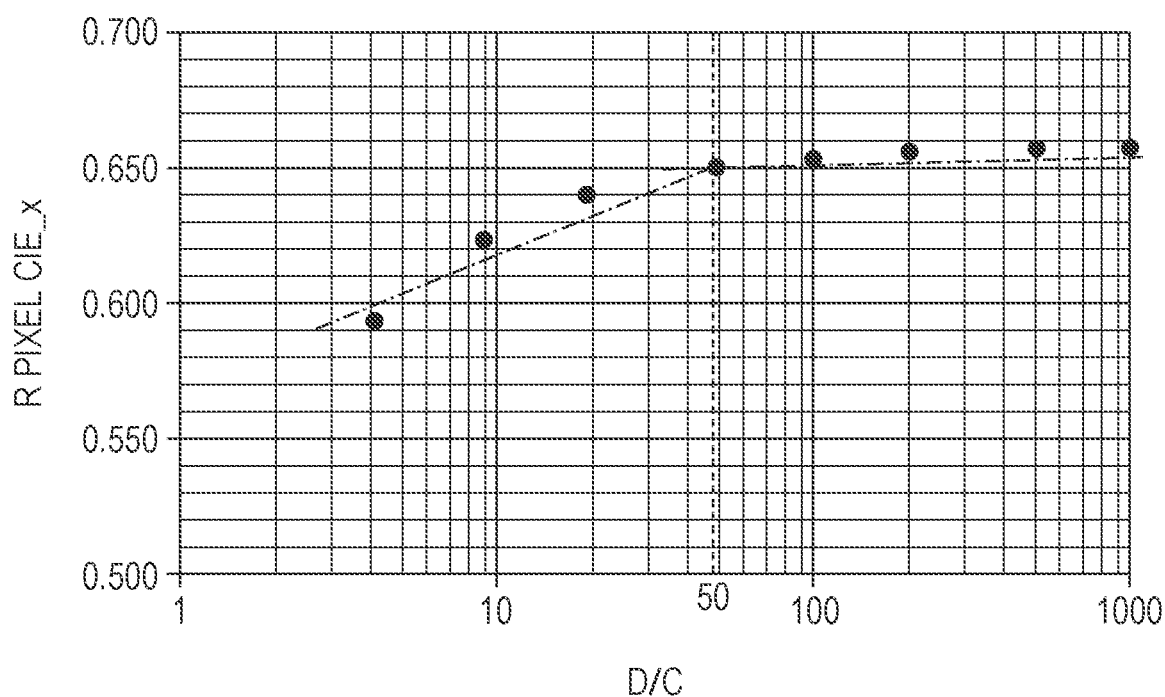
FIG. 5 is a graph showing the relationship between the chromaticity of a red pixel and a ratio of a distance D between edges of an insulating layer on two adjacent lower electrodes to a layer thickness C of an organic layer that is in contact with a lower electrode.

FIG. 4 is a schematic view of a light-emitting device including a light-emitting element 10R having a red color filter 7R and a light-emitting element 10G having a green color filter 7G. The difference from FIG. 1 is that the insulating layer does not have the slope portions and is provided only between the lower electrodes 2.

The equivalent circuit of the light-emitting element 10R is superimposed on the schematic view. The equivalent circuit in FIG. 4 shows, for example, the resistance of the organic layer 4, but FIG. 4 does not show that the electronic circuit is incorporated. Furthermore, in order to explain the leakage current between the lower electrodes 2, the equivalent circuit of the light-emitting element 10G is also illustrated.

The organic layer 4 has, in a portion in contact with the lower electrode 2R and the lower electrode 2G, a thickness C in a direction perpendicular to the lower surfaces of the lower electrodes 2. The distance from an edge of the insulating layer 3 in contact with the lower electrode 2R to an edge of the insulating layer 3 in contact with the lower electrode 2G is denoted by D. A resistance per unit area of the organic layer 4 in the perpendicular direction is denoted by r.

The effect of reducing the leakage current between the lower electrodes 2 of the semiconductor device according to the present embodiment is more significantly achieved when a ratio (D/C) of the distance D to the thickness C of the organic layer 4 is less than 50. A smaller ratio of the distance D to the thickness C of the organic layer 4 means a smaller distance between light emission areas relative to the thickness of the organic layer 4. That is, a device having a smaller value of this ratio is a device in which the light-emitting elements 10 are arranged at a higher density, and the problem of the leakage current between the lower electrodes 2 is more likely to occur. The reason for this will be described below.

In the light-emitting device in FIG. 4, a resistance per unit area of the organic layer 4 in a direction parallel to the lower surfaces of the lower electrodes 2 is expressed by r(D/C). Here, when a current flowing through the light-emitting element 10R is denoted by $I_R$, and a current flowing through the light-emitting element 10G is denoted by $I_G$, the following relationship holds.

$$I_G/I_R = 1/(1+D/C) \qquad (1)$$

Formula (1) above shows that the current flowing through the light-emitting element 10R and the current flowing through the light-emitting element 10G have a proportional relationship with a coefficient including the thickness C of the organic layer 4 and the distance D. Specifically, even in the case where light emission is desired to be caused only from the red light-emitting element 10R, a current also flows through the green light-emitting element 10G to cause light emission. This phenomenon depends on D/C.

In the case where light is emitted from the red light-emitting element 10R and from the green light-emitting element 10G with the same amount of current, where the emission spectrum of the red light-emitting element 10R alone is denoted by $S_R$ and the emission spectrum of the green light-emitting element 10G alone is denoted by $S_G$, an emission spectrum $S_{R+G}$ considering the leakage current between the lower electrodes 2 is expressed by Formula (2) below.

$$S_{R+G} = S_R + S_G(I_G/I_R) \qquad (2)$$

The chromaticity coordinates of the emission spectrum $S_{R+G}$ in CIExy space are calculated. The resulting x value is plotted on the vertical axis, and the ratio D/C is plotted on the horizontal axis to obtain a graph illustrated in FIG. 5. In FIG. 5, a change in the x-coordinate means that, although red-light emission is intended, green light is also emitted. Specifically, in FIG. 5, a low value of the x-coordinate means the occurrence of flowing of a leakage current to an adjacent pixel. When the ratio D/C is 50 or more, the x value does not substantially change. Specifically, even in the case where the insulating layer 3 does not have the slope portion 31 and the leakage current between the lower electrodes 2 tends to flow, the problem of the leakage current between the lower electrodes 2 may be prevented when the ratio D/C is 50 or more.

On the other hand, when the ratio D/C is less than 50, the x value considerably decreases, and consequently, the red color purity significantly decreases. These results show that the leakage current between the lower electrodes 2 affects the color purity. That is, when the ratio D/C is less than 50, the leakage current between the lower electrodes 2 significantly affects the light-emitting device because light-emitting elements are arranged at a high density. Accordingly, in the case where the ratio D/C is less than 50, a particularly high effect of reducing the leakage current between the lower electrodes 2 is provided.

Next, a description will be made of a structure in which optical interference of a light-emitting element is considered. The optical distance between the upper electrode 5 and the lower electrode 2 of the light-emitting device 100 according to the present embodiment may provide a constructive interference structure. The constructive interference structure can also be referred to as a resonance structure.

In the light-emitting elements 10, a plurality of layers included in the organic layer 4 are formed so as to satisfy constructive optical interference conditions, so that light extracted from the light-emitting device can be enhanced by optical interference. When optical conditions are determined so as to enhance extraction light in the front direction, light is radiated in the front direction at higher efficiency. Light enhanced by optical interference is known to have an emission spectrum having a smaller half-width than the emission spectrum before interference. Specifically, the color purity can be improved.

In the case of designing for light of a wavelength λ, a distance do from the emission position of the light-emitting layer to the reflection surface of a light reflecting material is adjusted so as to satisfy $d_0 = i\lambda/4n_0$ (where i=1, 3, 5, ...) to thereby provide a constructive interference.

As a result, the amount of a component in the front direction is increased in the radiation distribution of light of the wavelength λ, to improve the front luminance. In the above equation, n0 represents the refractive index for the wavelength λ of a layer from the emission position to the reflection surface.

An optical distance Lr from the emission position to the reflection surface of a light reflective electrode is expressed by Formula (3) below where the sum of the amount of phase shift when light of the wavelength λ is reflected at the reflection surface is denoted by φr [rad]. The optical distance L is the sum of the product of the refractive index nj and the thickness dj of each layer of the organic layer. Accordingly, L is expressed by Σnj×dj or by n0×d0. Note that φ is a negative value.

$$Lr = (2m - (\varphi r/\pi)) \times (\lambda/4) \qquad (3)$$

In Formula (3) above, m is an integer of 0 or more. In the case of φ=−π, m=0 results in L=λ/4, and m−1 results in L=3λ/4. Hereafter, the condition of m=0 in the above formula will be referred to as the λ/4 optical interference condition, and the condition of m=1 in the above formula will be referred to as the 3λ/4 optical interference condition.

An optical distance Ls from the emission position to the reflection surface of a light extraction electrode is expressed by Formula (4) below where the sum of the amount of phase shift when light of the wavelength λ is reflected at the reflection surface is denoted by φs [rad]. In Formula (4) below, m' is an integer of 0 or more.

$$Ls = (2m' - (\varphi s/\pi)) \times (\lambda/4) \times (\lambda/4) \qquad (4)$$

Therefore, an all-layer interference L is expressed by Formula (5) below.

$$L = (Lr + Ls) = (2m - (\varphi/\pi)) \times (\lambda/4) \qquad (5)$$

Here, φ represents the sum of the amounts of phase shifts (φr+φs) when light of the wavelength λ is reflected at the light reflective electrode and at the light extraction electrode.

In this case, regarding actual light-emitting elements, there is no need to strictly satisfy Formula (5) above in consideration of, for example, viewing angle characteristics, which are in trade-off relationship with the front extraction efficiency. Specifically, L may have an error within the range of ±λ/8 from the value satisfying Formula (5). The allowable error of the value of L from the interference condition may be 50 nm or more and 75 nm or less.

Accordingly, an organic light-emitting device according to the present disclosure may satisfy Formula (6) below. Furthermore, L may be within a range of ±λ/16 from the value satisfying Formula (5) and may satisfy Formula (6') below.

$$(\lambda/8) \times (4m - (2\varphi/\pi) - 1) < L < (\lambda/8) \times (4m - (2\varphi/\pi) + 1) \quad (6)$$

$$(\lambda/16) \times (8m - (4\varphi/\pi) - 1) < L < (\lambda/16) \times (8m - (4\varphi/\pi) + 1) \quad (6')$$

The light-emitting elements 10 may satisfy, in Formula (6) and Formula (6'), m=0 and m'=0, that is, the λ/4 optical interference condition. In this case, Formula (6) and Formula (6') are expressed as Formula (7) and Formula (7'), respectively.

$$(\lambda/8) \times (-(2\varphi/\pi) - 1) < L < (\lambda/8) \times (-(2\varphi/\pi) + 1) \quad (7)$$

$$(\lambda/16) \times (-(4\varphi/\pi) - 1) < L < (\lambda/16) \times (-(4\varphi/\pi) + 1) \quad (7')$$

In Formula (6) and Formula (6'), when m=0 and m'=0 are satisfied, the organic layer 4 has the smallest thickness in the constructive interference structure. In this case, the driving voltage of the light-emitting elements 10 decreases to thereby achieve emission with higher luminance at a voltage within a range equal to or lower than the upper limit of the power supply voltage. When the thickness of the organic layer 4 is reduced, the leakage current between the upper electrode 5 and the lower electrode 2 tends to flow. Therefore, a reduction in the thickness of the organic layer 4 using the slope of the insulating layer 3 cannot be easily performed.

Therefore, by satisfying the requirements described in the present embodiment, the leakage current between the lower electrodes 2 can also be sufficiently reduced while the leakage current between the upper electrode 5 and the lower electrode 2 is reduced.

Herein, the emission wavelength λ may be the emission wavelength of a peak having the highest emission intensity in an emission spectrum of light emitted from the light-emitting layer. In general, emission from an organic compound has the highest emission intensity at the shortest wavelength peak among peaks in the emission spectrum. Therefore, the emission wavelength λ may be the wavelength at the shortest wavelength peak.

The thickness of a portion of the organic layer 4 in the direction perpendicular to the lower surface of the lower electrode 2, the portion being in contact with the lower electrode 2, may be less than 100 nm. In this case, the driving voltage of the semiconductor device is easily reduced. Furthermore, this structure increases the effect of reducing the leakage current between the lower electrodes 2 while reducing the leakage current between the upper electrode 5 and the lower electrode 2, the effect being achieved by the present embodiment.

A description has been made of an example in which the surfaces of the steep slope portion 312 and the steep slope portion 313 slope at more than 50° and 90° or less with respect to the parallel surface. However, the slope angle is not limited thereto. For example, the surface of the steep slope portion 312 or the surface of the steep slope portion 313 may slope at an angle of more than 90° with respect to the parallel surface parallel to the lower surface of the lower electrode 2. In such a case, the thickness of the hole transport layer disposed on the insulating layer 3 can be effectively reduced, and, in some cases, a structure in which the hole transport layer is disconnected can be provided. This structure can reduce or prevent the leakage of a current from the lower electrode 2 to another component or an adjacent pixel through the hole transport layer.

In this case, the thickness of the organic layer 4 at a position at which the lower electrode 2 and the organic layer 4 are in contact with each other may be larger than the height of the steep slope portion 312 or 313 in the perpendicular direction. This structure enables disconnection of the upper electrode 5 to be suppressed.

In the case where the surfaces of the steep slope portion 312 and the steep slope portion 313 slope at more than 50° and 90° or less with respect to the parallel surface, the thickness of the hole transport layer can be reduced without disconnecting the organic layer 4, and thus the light-emitting elements can have enhanced reliability.

Second Embodiment

Figure 6:
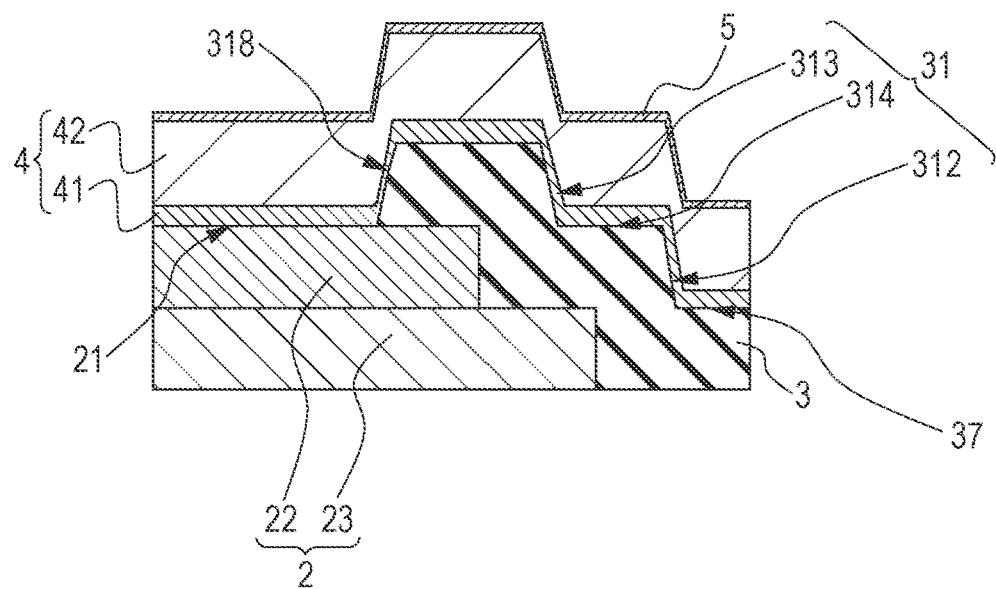
FIG. 6 is an enlarged view of a schematic sectional view illustrating the structure of a part of a light-emitting device according to an embodiment.

A second embodiment will be described with reference to FIG. 6. Unlike the semiconductor device of the first embodiment that has the steep slope portions 312 and 313 and the gentle slope portion 314 in the opening of the insulating layer 3, a semiconductor device of this embodiment includes an insulating layer 3 having steep slope portions 312 and 313 and a gentle slope portion 314 along an edge of a lower electrode 2. An upper surface 37 of a portion of the insulating layer 3, the portion being located closer to the element substrate 1 than the steep slope portion 312, has a slope angle of 0° or more and less than 50°. Hereafter, descriptions of, for example, the structures, materials, and advantages that are similar to those of the first embodiment will be omitted.

The steep slope portions 312 and 313 and the gentle slope portion 314 may be provided in a slope portion 31 of the insulating layer 3, the slope portion 31 being located on an edge portion of the lower electrode 2. It is difficult to reduce the total layer thickness of the lower electrode 2 in order to maintain the reflectance. Accordingly, the slope portion 31 of the insulating layer 3 along the edge portion of the lower electrode 2 tends to become a steep slope portion having a large height. Therefore, such a steep slope portion 31 is divided into the steep slope portion 312 and the steep slope portion 313, and the gentle slope portion 314 is provided therebetween. With this structure, the leakage current between an upper electrode 5 and the lower electrode 2 can be reduced.

The lower electrode 2 may have a multilayer structure of a conductive layer 23 and a conductive layer 22. The conductive layer 23 protrudes further than the conductive layer 22 in the direction of an adjacent pixel. This shape can be formed by depositing a film serving as the conductive layer 23 and a film serving the conductive layer 22, and subsequently performing etching twice in different areas. An insulating layer 3 is formed thereon to thereby provide the insulating layer 3 that reflects the shape of the lower electrode 2.

The conductive layer 22 and the conductive layer 23 may be made of the same material. However, the conductive layer 22 and conductive layer 23 that are made of different materials are advantageous in terms of process because the etching material selectivity is easily ensured. In such a case, the conductive layer 22 may be formed by using a material having a higher reflectance than the conductive layer 23. Alternatively, the conductive layer 22 and the conductive layer 23 may each form a multilayer structure of metals.

Third Embodiment

Figure 7:
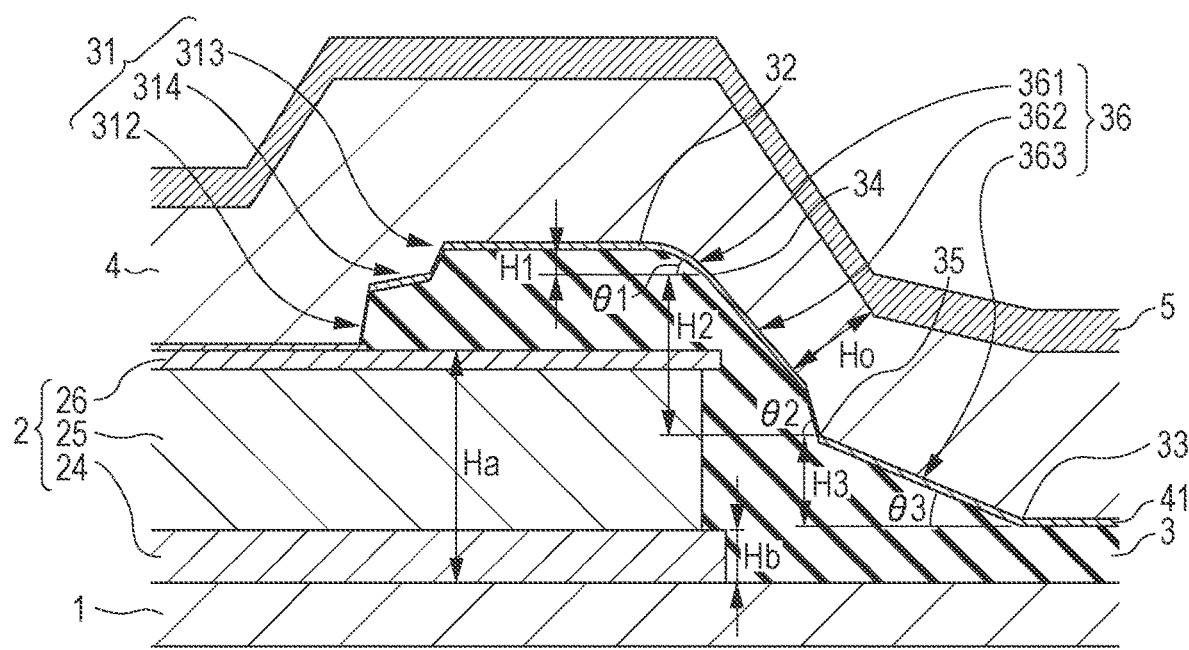
FIG. 7 is an enlarged view of a schematic sectional view illustrating the structure of a part of a light-emitting device according to an embodiment.

FIG. 7 is a sectional view of a part of a semiconductor device according to a third embodiment. An example of a case where the semiconductor device is a light-emitting device will be described as in the first embodiment. Hereafter, descriptions of, for example, the structures, materials, and advantages that are similar to those of the first embodiment will be omitted, and differences and advantages achieved by the differences will be described.

An insulating layer 3 of this embodiment has the structure described in the first embodiment in a portion that forms an opening and a slope portion 36 in a portion on the edge of a lower electrode 2. In FIG. 7 illustrating a section having an element substrate 1, the insulating layer 3, and an organic layer 4, the slope portion 36 has slope portions 361, 362, and 363.

The slope portion 362 has a surface that slopes at 45° or more and 90° or less with respect to a surface parallel to the lower surface of the lower electrode 2. The slope portion 363 is located closer to the element substrate than the slope portion 362 and has a surface that slopes at more than 0° and less than 45° with respect to the parallel surface. The slope portion 361 is located closer to the organic layer than the slope portion 362 and has a surface that slopes at more than 0° and less than 45° with respect to the parallel surface. A length of the slope portion 363 in a direction perpendicular to the parallel surface is larger than a length of the slope portion 361 in the perpendicular direction.

The lower electrode 2 may be constituted by sequentially stacking, in ascending order from the interlayer insulating layer on the uppermost surface of the element substrate 1, a barrier metal layer 24, a reflective metal layer 25, and an injection efficiency adjusting layer 26 for adjusting the hole injection efficiency. The barrier metal layer 24 may be a single layer or may have a multilayer structure. The barrier metal layer 24 may be constituted by, for example, stacking, in ascending order from the element substrate 1, a Ti film having a thickness in the range of 1 to 50 nm and a TiN film having a thickness in the range of 1 to 50 nm. The reflective metal layer 25 may be formed of, for example, an alloy containing Al. The reflective metal layer 25 may have a thickness of 50 nm or more in order to obtain a high reflectance.

The injection efficiency adjusting layer 26 may be formed of a Ti film having a thickness in the range of 1 to 50 nm in consideration of, for example, a decrease in the reflectance of the lower electrode 2. The upper limit of the thickness of the lower electrode 2 including the barrier metal layer 24, the reflective metal layer 25, and the injection efficiency adjusting layer 26 may be determined so as to sufficiently cover the roughness of the surface or so that the insulating layer 3 and organic layer 4 covering the lower electrode 2 can sufficiently cover the difference in level formed by the lower electrode 2.

The insulating layer 3 may have, for example, a thickness in the range of 50 to 100 nm. In a slope portion 31, as in the first embodiment, a length of a steep slope portion 312 or a steep slope portion 313 in a direction perpendicular to the lower surface of the lower electrode 2 is larger than a thickness of a portion of a charge transport layer in the perpendicular direction, the portion being in contact with the lower electrode 2. Accordingly, the leakage current between lower electrodes 2 can be effectively reduced. In addition, the leakage current between an upper electrode 5 and the lower electrode 2 can be reduced.

The organic layer 4 includes a hole transport layer. The organic layer 4 has a thinnest portion at a position that covers the slope portion 36, and the thinnest portion has a thickness Ho. Points at both ends of the slope portion 36 where the slope angles are 0° are an upper end 32 and a lower end 33 of the slope portion 36. In the case of the planar structure illustrated in FIG. 2, the slope portion 36 is disposed so as to extend along all the sides of each of the hexagons.

The slope portion 361 is formed at an angle $\theta 1$ with respect to the upper surface of the lower electrode. When the upper surface of the lower electrode is parallel to the horizontal surface, the angle of the slope portion 361 may be $\theta 1$ with respect to the horizontal surface. Similarly, the slope portion 362 is formed at an angle $\theta 2$ with respect to the upper surface of the lower electrode, and the slope portion 363 is formed at an angle $\theta 3$ with respect to the upper surface of the lower electrode.

In this embodiment, the slope angles $\theta 1$ and $\theta 3$, and $\theta 2$ of the steep slope portions and the gentle slope portion of the insulating layer may be constant in the slope portions as illustrated in FIG. 3A. Alternatively, the slope angles may vary depending on the points of the slope portions as long as the slope angles are each within the range of the defined angle. Alternatively, the slope angles may gradually vary along the slope portions. Specifically, $\theta 1$ and $\theta 3$ each have 0° to 45°, and $\theta 2$ has 45° to 90°. In this case, the slope angles $\theta 1$, $\theta 2$, and $\theta 3$ of the slope portion 361, the slope portion 362, and the slope portion 363 are not constant, and the boundary thereof is, from the upper end 32 toward the lower end 33, a point 34 at which the slope angle exceeds 45° or a point 35 at which the slope angle becomes smaller than 45°.

In this embodiment, for example, the slope angle $\theta 1$ gradually varies along the slope portion, the slope angle $\theta 2$ varies at a point of the slope portion, and the slope angle $\theta 3$ is constant.

The slope portion 361 has a height H1 in a direction perpendicular to the upper surface of the lower electrode. Similarly, the slope portion 362 has a height H2 in the direction perpendicular to the upper surface of the lower electrode, and the slope portion 363 a height H3 in the direction perpendicular to the upper surface of the lower electrode. The lower electrode 2 has a thickness Ha, and the barrier metal layer 24 that forms the lower electrode 2 has a thickness Hb.

In this embodiment, the height H3 of the slope portion 363 is larger than the height H1 of the slope portion 361, and the height H3 of the slope portion 363 is larger than the thickness Hb of the barrier metal layer 24. The height H2 of the slope portion 362 is smaller than the thickness Ha of the lower electrode 2. With this structure, the resistance of the organic layer 4 formed on the slope portion 362 can be locally increased to thereby reduce the leakage current between lower electrodes 2. Furthermore, the thickness Ho can be increased, and the leakage current between the upper electrode and the lower electrode can be reduced. The thickness Ho may be 35 nm or more.

Fourth Embodiment

Figure 8:
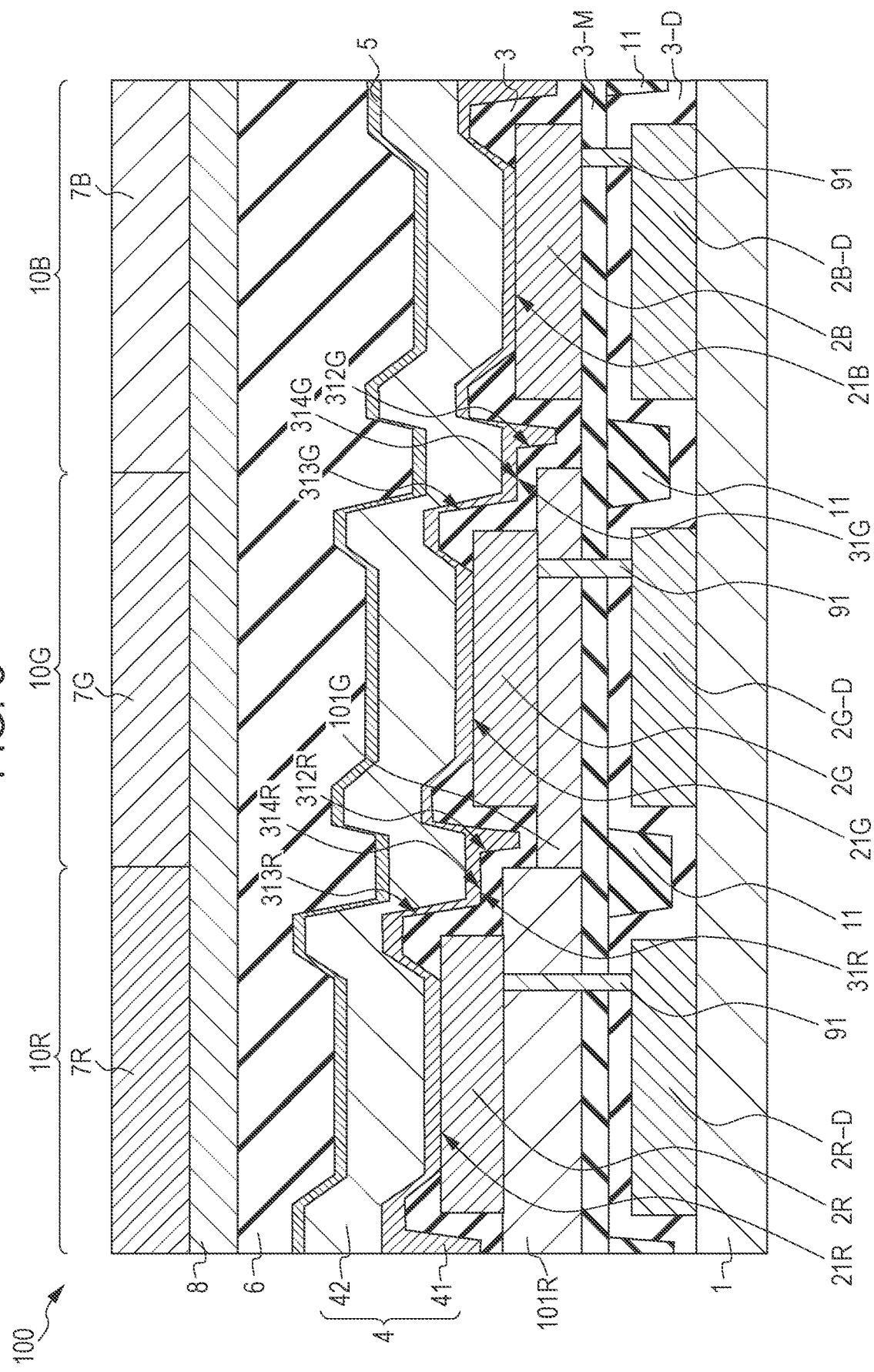
FIG. 8 is an enlarged view of a schematic sectional view illustrating the structure of a part of a light-emitting device according to an embodiment.

FIG. 8 is a sectional view of (a light-emitting device which is an example of) a semiconductor device according to a fourth embodiment. Hereafter, descriptions of, for example, the structures, materials, and advantages that are similar to those of the first embodiment will be omitted, and differences and advantages achieved by the differences will be described.

Lower electrodes 2 (2R, 2G, and 2B) and reflective electrodes 2-D (2R-D, 2G-D, and 2B-D) are formed via plugs 91. An insulating layer 3 is disposed between the lower electrodes 2 of adjacent light-emitting elements 10. A lower insulating layer 3-D is disposed between the reflective electrodes 2-D of the adjacent light-emitting elements 10. The lower insulating layer 34) has a recess between the reflective electrodes 2-D, and an insulating layer 11 is disposed between sidewalls of the recess. The upper surface of the insulating layer 11 between the sidewalls is covered with an intermediate insulating layer 3-M.

The reflective electrodes 2-D are disposed on an element substrate 1, and the intermediate insulating layer 3-M is disposed between the reflective electrodes 2-D and the lower electrodes 2. In a subpixel on which a light-emitting element 10R is disposed, an optical adjustment layer 101R is disposed between the intermediate insulating layer 3-M and the lower electrode 2R. In a subpixel on which a light-emitting element 10G is disposed, an optical adjustment layer 101G is disposed between the intermediate insulating layer 3-M and the lower electrode 2G. In this embodiment, the reflective electrode 2-D is disposed between the optical adjustment layer 101 and the element substrate 1. However, the layer disposed between the optical adjustment layer 101 and the element substrate 1 does not necessarily have a function of an electrode as long as the layer is a reflective layer.

In FIG. 8, the optical adjustment layer 101R and the optical adjustment layer 101G are illustrated as different insulating layers. Alternatively, a common insulating layer may be disposed between the intermediate insulating layer 3-M and the lower electrodes 2R and 2G, and another insulating layer may further be disposed between the common insulating layer and the lower electrode 2R.

The optical adjustment layer 101 is, for example, an insulating layer and may be an inorganic insulating layer or an organic insulating layer. From the viewpoint of suppressing entry of water in the organic layer, the optical adjustment layer 101 may be an inorganic insulating layer. Specifically, for example, the optical adjustment layer 101 can be formed by using any one of silicon oxide (SiOx), silicon nitride (SiNx), and silicon oxynitride (SiON) or a combination thereof.

The lower electrodes 2 are further formed thereon, and the insulating layer 3 is formed so as to cover a part of each of the lower electrodes 2. In this embodiment, a steep slope portion 312R and a gentle slope portion 3148 of the insulating layer 3 cover an edge portion of the optical adjustment layer 101R, and a steep slope portion 313R is located on the optical adjustment layer 101R Similarly, a steep slope portion 312G and a gentle slope portion 314G cover an edge portion of the optical adjustment layer 101G, and a steep slope portion 313G is located on the optical adjustment layer 101G.

Structures of this embodiment are the same as those of the first embodiment except for the structure described above. In this case, in the section in FIG. 8, the steep slope portions 312 and 313 and the gentle slope portion 314 are located between the lower electrode 2R and the lower electrode 2G, between the lower electrode 2G and the lower electrode 2B, or between the lower electrode 2B and the lower electrode 2R.

The reflective electrodes 2-D are light reflective electrodes and may be formed of the same material as the material of the lower electrodes 2 of the first embodiment. The lower insulating layer 3-D, the intermediate insulating layer 3-M, and the optical adjustment layers 101 are light-transmissive insulators and may be formed of the same material as the material of the insulating layer 3 of the first embodiment. The lower electrodes 2 are light-transmissive conductors and may be formed of a conductive oxide such as indium tin oxide (ITO) or indium zinc oxide (IZO).

Since the light-emitting device of this embodiment has the structure described above, the distances relating to the optical interference of the red light-emitting element 10R, the green light-emitting element 10G, and the blue light-emitting element 10B can be optimized in each of the light-emitting elements.

A slope portion 31R of the insulating layer 3 along the lower electrode 2R of an R pixel has a steep slope portion 312R, a steep slope portion 313R, and a gentle slope portion 314R. A slope portion 31G of the insulating layer 3 along the lower electrode 2G of a G pixel has a steep slope portion 312G, a steep slope portion 313G, and a gentle slope portion 3140. Although not illustrated, a slope portion of the insulating layer 3 along a lower electrode 2R of an R pixel also has a steep slope portion, a steep slope portion, and a gentle slope portion.

In the first embodiment, a layer whose change in thickness relates to the optical interference is limited to the organic layer 4 between the lower electrode 2 and the upper electrode 5. In contrast, in this embodiment, such a layer includes, in addition to the organic layer 4, layers ranging from a layer immediately above the light-reflective reflective electrode 2-D to the light-transmissive lower electrode 2. In consideration of this, it is necessary to set the thickness of the organic layer 4 to be small. Therefore, in the slope portion 31 of the insulating layer 3, the organic layer 4 has a smaller thickness, and a leakage current is more likely to flow between the upper electrode and the lower electrode. Accordingly, the light-emitting device of this embodiment can significantly exhibit the effect of reducing the leakage current described in the first embodiment.

In a light-emitting device in which, as in this embodiment, the distance relating to the optical interference is optimized by adjusting the thickness of a layer below the organic layer 4 (i.e., closer to the element substrate than the organic layer 4) for each light-emitting element of each color, a layer immediately below the organic layer 4 tends to have a large difference in level between light-emitting elements. Accordingly, the light-emitting device of this embodiment can significantly exhibit the effect obtained by dividing the steep slope portion into the steep slope portions 312 and 313 and providing the gentle slope portion 314 therebetween.

In the subpixels of each color in this embodiment, the steep slope portion 312, the steep slope portion 313, and the gentle slope portion 314 may be provided between subpixels having the largest difference in height between the surfaces of the lower electrodes 2. Since the organic layer 4 tends to have the smallest thickness between such subpixels having the largest difference in height between the surfaces of the lower electrodes 2, the effect of reducing the leakage current can be significantly exhibited.

Figure 9:
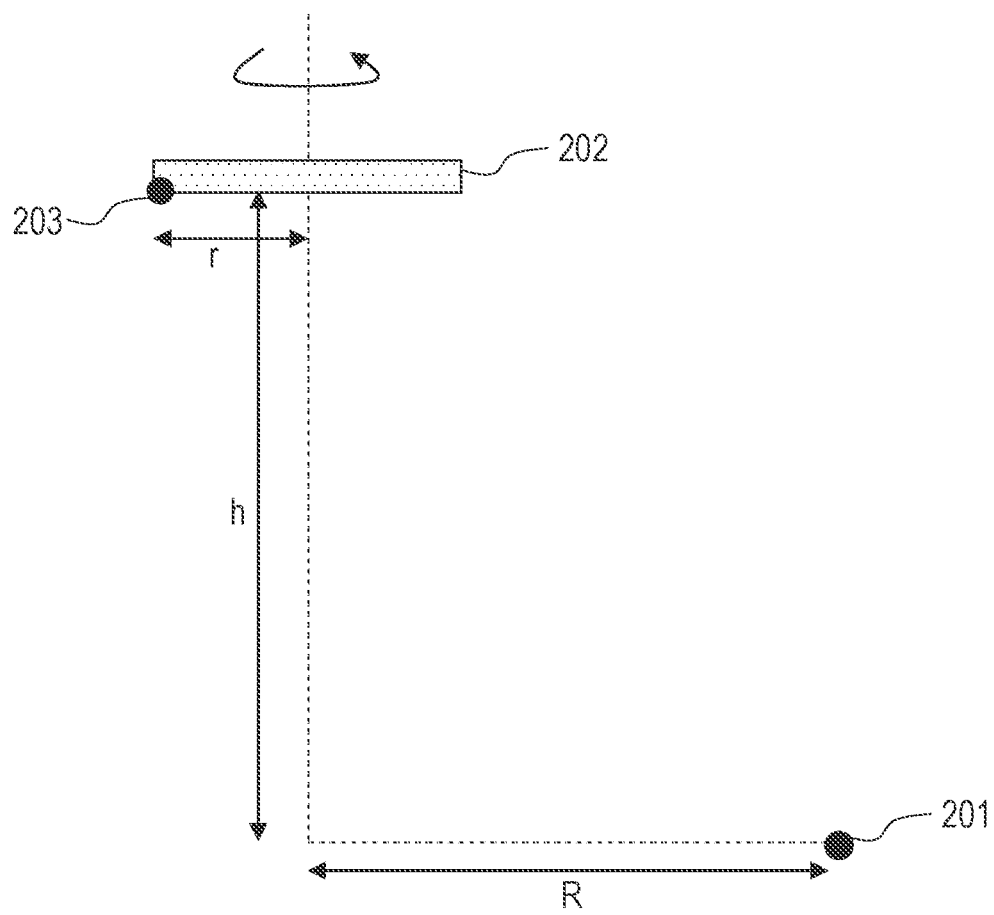
FIG. 9 is a view illustrating the arrangement of members in a vapor deposition simulation.

In this embodiment, the steep slope portion 312 and the steep slope portion 313 have a slope angle of more than 50° and 90° or less, and the gentle slope portion 314 has a slope angle of 50° or less. This is because a region of the organic layer 4 along the slope portion 31 tends to have a small thickness at a slope angle of more than 50° and 90° or less, and the organic layer 4 along the slope portion 31 tends to have a large thickness at a slope angle of 50° or less. In order to support this, a simulation of film formation by vapor deposition was performed. FIG. 9 is a view illustrating the arrangement of members in the vapor deposition simulation. An evaporation source 201, a substrate 202, and an organic device 203 disposed on the substrate were positioned as illustrated in FIG. 9 such that R=200 mm, r=95 mm, and h=340 mm were satisfied.

The simulation was performed in accordance with a vapor deposition distribution represented by Formula (8) below, where n=2.

$$\pi = \pi_0 \cos^n \alpha \quad (8)$$

In Formula (8), α represents an angle, φ represents a vapor flow density at an angle α, and $\varphi_0$ represents a vapor flow density when α=0. The substrate 202 was assumed to be rotated about the center of the substrate.

Figure 10:
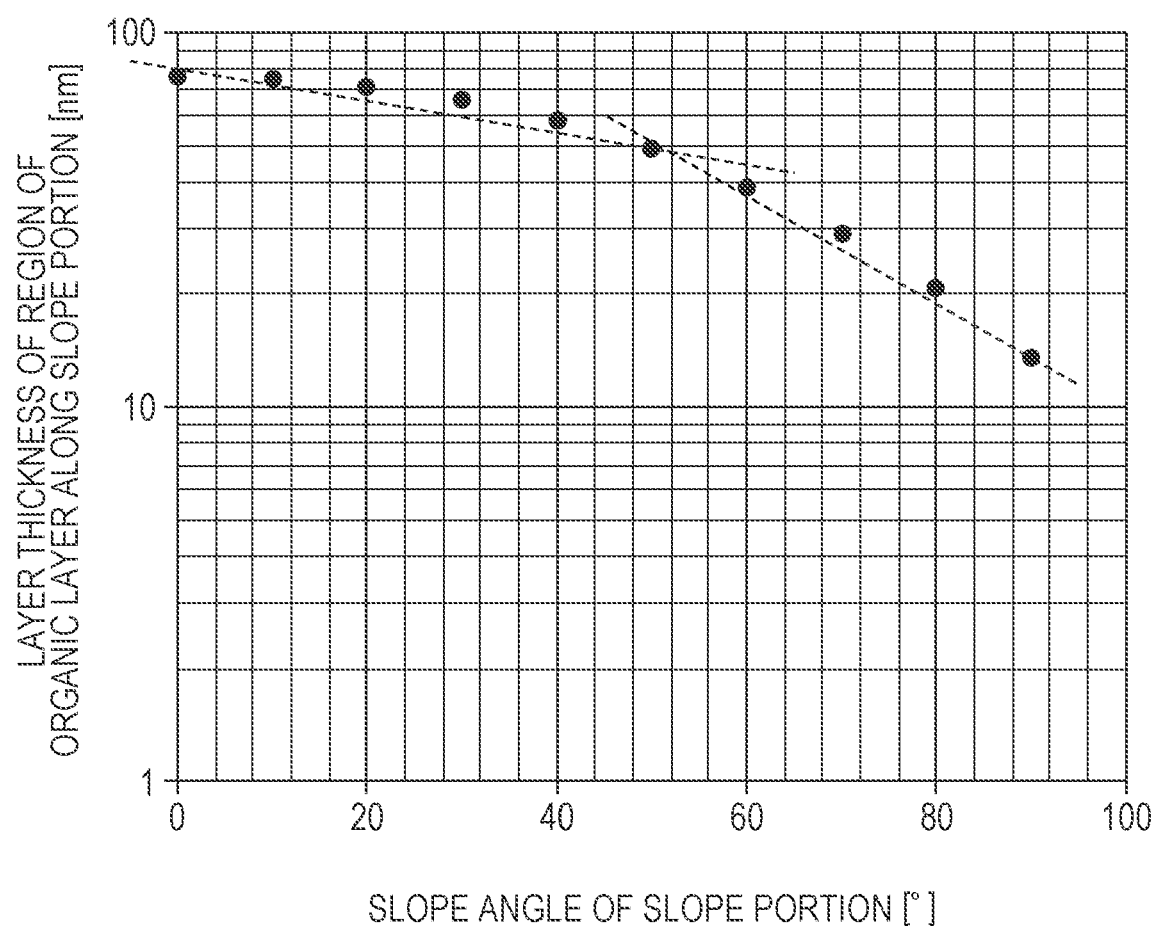
FIG. 10 is a graph of the results of the vapor deposition simulation.

A slope portion having a slope angle of 0° to 90° was assumed to be disposed at the position of the organic device 203 on the substrate, and the layer thickness of an organic layer at a slope angle of 0° was set to 76 nm. In this case, the layer thicknesses of regions of the organic layers along the slope portions at different slope angles were calculated. FIG. 10 shows the results of the simulation of film formation. The graph shows a folding point at 50°.

Accordingly, when the angles of the steep slope portions 312 and 313 are more than 50°, the thicknesses of the organic layer 4 and the charge transport layer 41 can be reduced to effectively reduce the leakage current between the lower electrodes 2. In addition, when the slope angles of the steep slope portions 312 and 313 are adjusted within the range of more than 50° and 90° or less, layer thicknesses of thin portions of the organic layer 4 and the charge transport layer 41, the thin portions contributing to the reduction in the leakage current, can be adjusted to suitable thicknesses.

Furthermore, when the slope angle of the gentle slope portion 314 between the steep slope portions 312 and 313 is 0° or more and 50° or less, it is possible to suppress an excessive decrease in the thicknesses of the organic layer 4 and the charge transport layer 41. Accordingly, while the leakage current between the upper electrode 5 and the lower electrode 2 is reduced, the leakage current between the lower electrodes 2 can also be reduced.

Fifth Embodiment

In a fifth embodiment, specific structures and examples of applications of the light-emitting devices according to the first to fourth embodiments will be described with reference to FIG. 11 to FIG. 15B.

Structure of Light-Emitting Element 10

A light-emitting element 10 is provided by disposing an anode, an organic compound layer, and a cathode on an element substrate having an interlayer insulating layer on the outermost surface thereof. For example, a protective layer and a color filter may be disposed on the cathode. In the case of disposing the color filter, a planarization layer 8 may be disposed between the color filter and the protective layer. The planarization layer may be formed of, for example, an acrylic resin.

Substrate

Examples of the substrate include quartz substrates, glass substrates, silicon wafers, resin substrates, and metal substrates. The substrate may include switching elements such as transistors and wiring lines and may further include an insulating layer thereon. Any material can be used as the insulating layer as long as a contact hole can be formed to establish the electrical connection between the anode 9 and a wiring line, and as long as insulation from a non-connected wiring line can be ensured. For example, a resin such as polyimide, silicon oxide, or silicon nitride can be used.

Interlayer Insulating Layer

The interlayer insulating layer may be formed from an inorganic material such as silicon oxide (SiOx), silicon nitride (SiNx), or silicon oxynitride (SiON) or an organic material such as an acrylic resin or a polyimide resin.

Electrode

An electrode used may be a pair of electrodes. The pair of electrodes may be an anode and a cathode. In the case where an electric field is applied in a direction in which the organic light-emitting element emits light, one electrode having a higher potential is the anode, and the other electrode is the cathode. In other words, the electrode that supplies holes to the light-emitting layer is the anode, and the electrode that supplies electrons is the cathode.

The material of the anode preferably has a work function that is as high as possible. Examples of the material that can be used include elemental metals such as gold, platinum, silver, copper, nickel, palladium, cobalt, selenium, vanadium, and tungsten; mixtures containing these metals; and alloys of combinations thereof. Examples thereof further include metal oxides such as tin oxide, zinc oxide, indium oxide, indium tin oxide (ITO), and indium zinc oxide. Furthermore, conductive polymers such as polyaniline, polypyrrole, and polythiophene may also be used.

These electrode materials may be used alone or in combination of two or more thereof. The anode may be formed of a single layer or a plurality of layers.

When the anode is used as a reflective electrode, for example, chromium, aluminum, silver, titanium, tungsten, molybdenum, an alloy thereof, or a stack thereof may be used. When the anode is used as a transparent electrode, a transparent conductive oxide layer made of, for example, indium tin oxide (ITO) or indium zinc oxide may be used; however, the anode is not limited thereto. The electrode may be formed by photolithography.

In contrast, the material of the cathode preferably has a low work function. Examples of the material of the cathode include alkali metals such as lithium; alkaline earth metals such as calcium; elemental metals such as aluminum, titanium, manganese, silver, lead, and chromium; and mixtures containing these metals. Alloys of combinations of these elemental metals may also be used. For example, magnesium-silver, aluminum-lithium, aluminum-magnesium, silver-copper, and zinc-silver may be used. Metal oxides such as indium tin oxide (ITO) may also be used. These electrode materials may be used alone or in combination of two or more thereof. The cathode may have a single-layer structure or a multilayer structure. In particular, silver is preferably used. To reduce the aggregation of silver, a silver alloy is more preferably used. Any alloy ratio may be used as long as the aggregation of silver can be reduced. For example, the alloy ratio may be 1:1.

The form of the cathode is not particularly limited. The cathode may be a conductive oxide layer made of, for example, ITO to provide a top-emission element. Alternatively, the cathode may be a reflective electrode made of, for example, aluminum (Al) to provide a bottom-emission element. Any method for forming the cathode may be used. For example, direct-current and alternating-current sputtering methods may be used because good film coverage is achieved to easily reduce the resistance.

Protective Layer

A protective layer may be disposed on the cathode. For example, a glass member provided with a moisture absorbent may be bonded to the cathode. Thus, entry of, for example, water into the organic compound layer can be reduced to suppress the occurrence of display defects. In another embodiment, a passivation film made of, for example, silicon nitride may be formed on the cathode to reduce entry of, for example, water into an organic EL layer. For example, after the formation of the cathode, the resulting substrate may be transferred to another chamber without breaking the vacuum, and a silicon nitride film having a thickness of 2 μm may be formed by CVD to provide a protective layer. After the film formation by CVD, a protective layer may be formed by atomic layer deposition (ALD).

Color Filter

A color filter may be disposed on the protective layer. For example, a color filter may be disposed on another substrate in consideration of the sizes of organic light-emitting elements, and this substrate may be bonded to the substrate provided with the organic light-emitting elements. Alternatively, a color filter may be formed by patterning on the protective layer described above using photolithography. The color filter may be formed of a polymer.

Planarization Layer

A planarization layer may be disposed between the color filter and the protective layer. The planarization layer may be formed of an organic compound. The organic compound may be a low-molecular-weight organic compound or a high-molecular-weight organic compound. A high-molecular-weight organic compound is preferred.

Such planarization layers may be disposed above and below the color filter and may be made of the same material or different materials. Specific examples thereof include polyvinylcarbazole resins, polycarbonate resins, polyester resins, acrylonitrile butadiene styrene (ABS) resins, acrylic resins, polyimide resins, phenolic resins, epoxy resins, silicone resins, and urea resins Opposite Substrate An opposite substrate may be disposed on the planarization layer. The opposite substrate is disposed at a position corresponding to the substrate described above and thus is referred to as an opposite substrate. The opposite substrate may be made of the same material as the material of the substrate described above.

Organic Layer

The organic layer (such as a hole injection layer, a hole transport layer, an electron blocking layer, a light-emitting layer, a hole blocking layer, an electron transport layer, or an electron injection layer) that forms a light-emitting element according to an embodiment are formed by the following method.

For the organic layer that forms the light-emitting element according to an embodiment, a dry process such as a vacuum vapor deposition method, an ionized vapor deposition method, sputtering, or plasma can be employed. Alternatively, instead of the dry process, it is also possible to employ a wet process in which a material is dissolved in a suitable solvent, and a layer is formed by a publicly known coating method (such as spin coating, dipping, a casting method, a Langmuir-Blodgett (LB) method, or an ink jet method).

When a layer is formed by, for example, the vacuum vapor deposition method or the solution coating method, for example, crystallization is unlikely to occur, and the resulting layer has good stability with time. When a film is formed by the coating method, the film may be formed by using a suitable hinder resin in combination.

Examples of the hinder resin include, but are not limited to, polyvinylcarbazole resins, polycarbonate resins, polyester resins, ABS resins, acrylic resins, polyimide resins, phenolic resins, epoxy resins, silicone resins, and urea resins.

These hinder resins may be used alone as a homopolymer or a copolymer or in combination as a mixture of two or more thereof. Furthermore, publicly known additives such as a plasticizer, an oxidation inhibitor, and an ultraviolet absorbent may be optionally used in combination.

Applications of Semiconductor Devices According to First to Fourth Embodiments

The semiconductor devices according to the first to fourth embodiments can be used as a member of a display apparatus or an illumination apparatus. In addition, the semiconductor devices may be used as, for example, an exposure light source of an electrophotographic image forming apparatus, a backlight of a liquid crystal display apparatus, or a light-emitting device including a White light source having a color filter.

The display apparatus may be an image information processing device that includes an image input unit configured to input image information from, for example, an area CCD, a linear CCD, or a memory card and an information processing unit configured to process the input information, and that displays an input image on a display unit.

The display unit included in an imaging apparatus or an ink jet printer may have a touch panel function. The touch panel function may be operated by using infrared, an electrostatic capacitance, a resistive film, or electromagnetic induction, and the operation method is not particularly limited. The display apparatus may be used as a display unit of a multifunctional printer.

Figure 11:
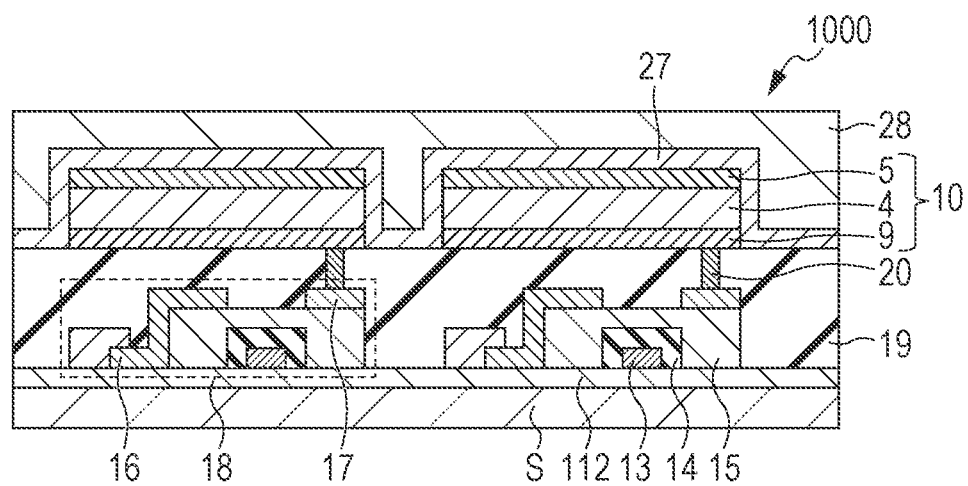
FIG. 11 is a schematic sectional view of an example of a display apparatus comprising a semiconductor device according to an embodiment.

Next, a display apparatus according to the present embodiment will be described with reference to the drawings. FIG. 11 is a schematic sectional view illustrating an example of a display apparatus that includes organic light-emitting elements and TFT elements connected to the organic light-emitting elements. The TFT elements are each an example of an active element.

A display apparatus 1000 in FIG. 11 includes a substrate S made of, for example, glass and a moisture-proof film 112 that is disposed on the substrate S and configured to protect TFT elements or organic compound layers. Reference numeral 13 denotes a gate electrode 13 made of a metal. Reference numeral 14 denotes a gate insulating film. Reference numeral 15 denotes a semiconductor layer.

TFT elements 18 each include the semiconductor layer 15, a drain electrode 16, and a source electrode 17. An insulating film 19 is disposed over the TFT elements 18. An anode 9 that forms a light-emitting element is connected to the source electrode 17 through a contact hole 20.

The form of electrical connection between electrodes (an anode and a cathode) included in an organic light-emitting element and electrodes (a source electrode and a drain electrode) included in a TFT element is not limited to the configuration illustrated in FIG. 11. Specifically, one of the anode and the cathode is electrically connected to one of the source electrode and the drain electrode of the TFT element.

In the display apparatus 1000 in FIG. 11, an organic layer 4 is illustrated as if the organic layer 4 is formed of a single layer. Alternatively, the organic layer 4 may be formed of a plurality of layers. A first protective layer 27 and a second protective layer 28 configured to suppress deterioration of the organic light-emitting elements are disposed over an upper electrode 5.

In the display apparatus 1000 in FIG. 11, transistors are used as switching elements. Alternatively, metal-insulator-metal (MIM) elements may be used as the switching elements instead of the transistors.

The transistors used in the display apparatus 1000 in FIG. 11 are not limited to transistors formed by using a single-crystal silicon wafer. Alternatively, the transistors may be thin-film transistors having an active layer on an insulating surface of a substrate. Examples of the material of the active layer include single-crystal silicon, amorphous silicon, non-single-crystal silicon such as microcrystalline silicon, and non-single-crystal oxide semiconductors such as indium zinc oxide and indium gallium zinc oxide. Thin-film transistors are also referred to as TFT elements.

The transistors included in the display apparatus 1000 in FIG. 11 may be formed in a substrate such as a Si substrate Herein, the expression "formed in a substrate" means that transistors are produced by processing a substrate, such as a Si substrate. That is, having transistors in a substrate can also be considered that a substrate and transistors are integrally formed.

In the light-emitting element 10 according to this embodiment, the emission luminance is controlled by a TFT, which is an example of a switching element. Accordingly, when a plurality of such light-emitting elements 10 are arranged in a plane, an image can be displayed by controlling the emission luminance of each of the light-emitting elements 10. The switching element according to this embodiment is not limited to a TFT The switching element may be a low-temperature polysilicon transistor or active-matrix driver formed on a substrate such as a Si substrate. The expression "on a substrate" can also be referred to as "in the substrate". Whether transistors are formed in the substrate or TFT elements are used is selected in accordance with the size of a display unit. For example, in the case Where the display unit has a size of about 0.5 inches, light-emitting elements can be formed on a Si substrate.

Figure 12:
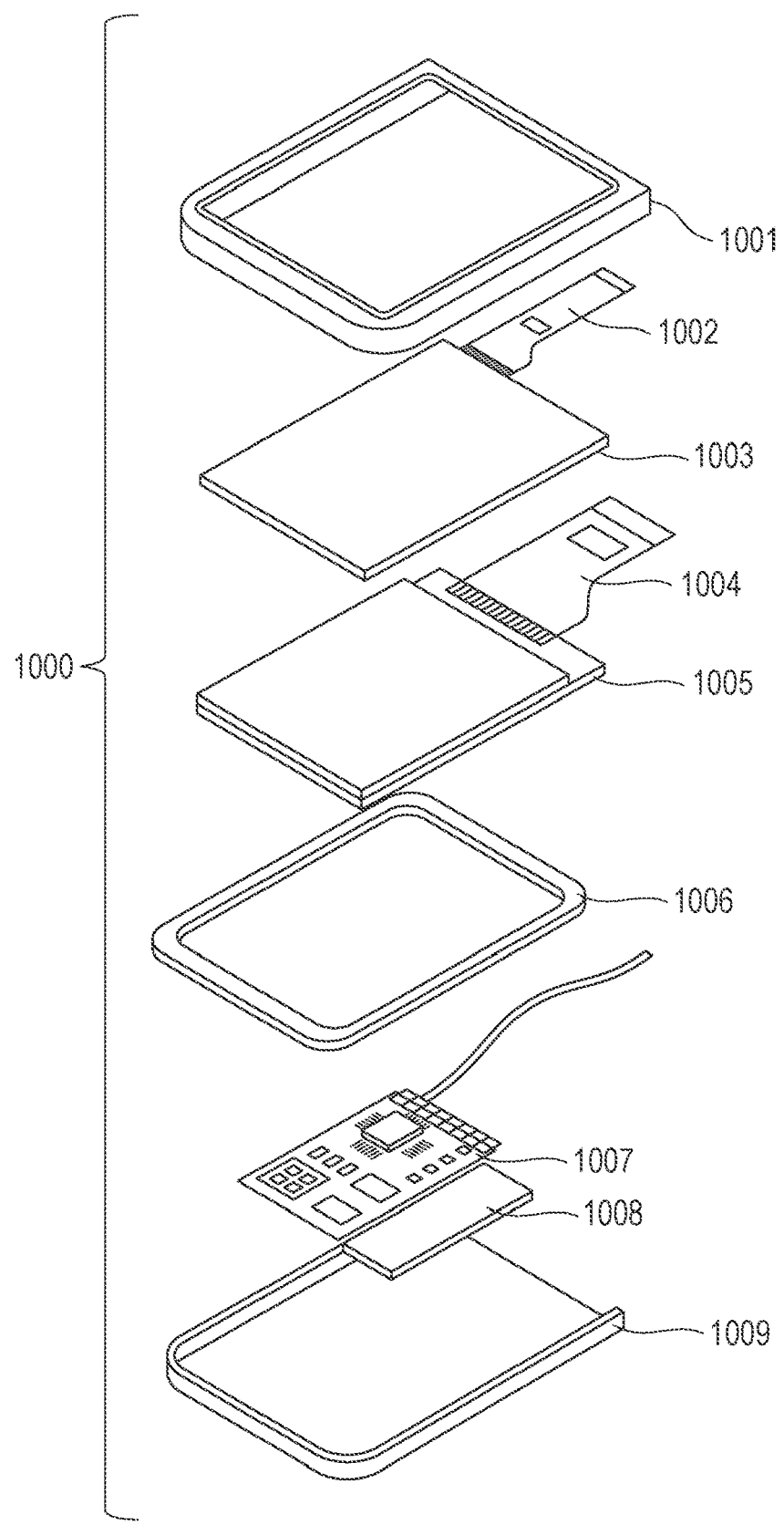
FIG. 12 is a schematic view illustrating an example of a display apparatus according to an embodiment.

FIG. 12 is a schematic view illustrating an example of a display apparatus according to the present embodiment. A display apparatus 1000 may include an upper cover 1001 and a lower cover 1009, and a touch panel 1003, a display panel 1005, a frame 1006, a printed circuit board 1007, and a battery 1008 that are disposed between the upper cover 1001 and the lower cover 1009. The touch panel 1003 and the display panel 1005 are connected to flexible printed circuits (FPC) 1002 and 1004, respectively. Transistors are printed on the printed circuit board 1007. The battery 1008 is not necessarily provided unless the display apparatus is a mobile apparatus. Even when the display apparatus is a mobile apparatus, the battery 1008 may be disposed at a different position.

The display apparatus according to the present embodiment may be used in a display unit of an imaging apparatus including an optical unit including a plurality of lenses and an imaging element that receives light which has passed through the optical unit. The imaging apparatus may include a display unit configured to display information acquired by a plurality of imaging elements included in an imaging unit. The display unit may be configured to acquire information by using the information acquired by the imaging elements and to display information that differs from the information acquired by the imaging elements.

The imaging element may be a photoelectric conversion element in which the organic layer of the light-emitting device described in any of the first to fourth embodiments functions as a photoelectric conversion layer. In this case, the imaging apparatus includes, in the imaging unit, a plurality of photoelectric conversion elements.

The display unit may be a display unit exposed to the outside of the imaging apparatus or a display unit disposed in a finder. The imaging apparatus may be a digital camera or a digital camcorder.

Figure 13A:
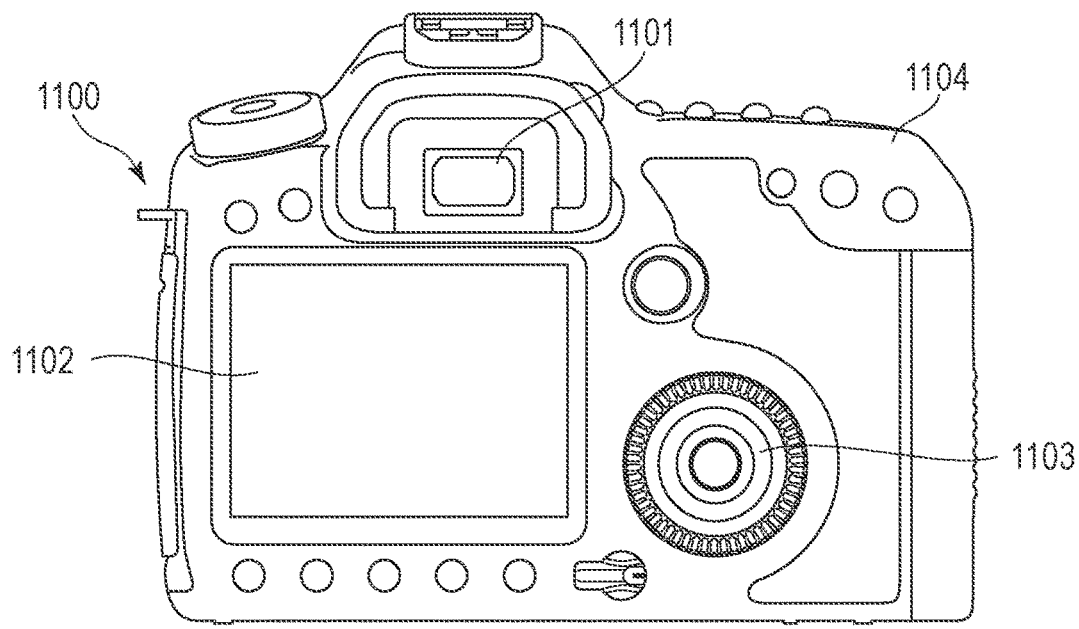
FIG. 13A is a schematic view illustrating an example of an imaging apparatus according to an embodiment.

FIG. 13A is a schematic view illustrating an example of an imaging apparatus according to the present embodiment. An imaging apparatus 1100 may include a viewfinder 1101, a rear display 1102, an operation unit 1103, and a housing 1104. The viewfinder 1101 may include the display apparatus according to the present embodiment. In such a case, the display apparatus may display not only an image to be captured but also, for example, environmental information and imaging instructions. The environmental information may include, for example, the intensity of external light, the direction of the external light, the moving speed of a subject to be captured, and the possibility that the subject is hidden by an object.

Since the suitable timing for capturing an image is a very short time, it is desirable to display information as quickly as possible. Accordingly, the display apparatus that includes the organic light-emitting element according to the present disclosure can be used. This is because the organic light-emitting element has a high response speed. The display apparatus that includes an organic light-emitting element can be more suitably used for such devices required to have a high display speed than liquid crystal display apparatuses.

The imaging apparatus 1100 includes an optical unit (not illustrated). The optical unit includes a plurality of lenses and forms an image on an imaging element disposed in the housing 1104. The focus can be adjusted by adjusting the relative positions of the plurality of lenses. This operation can also be automatically performed.

The display apparatus according to the present embodiment may include red, green, and blue color filters. The red, green, and blue color filters may be arranged in a delta array.

The display apparatus according to the present embodiment may be used in a display unit of a mobile terminal. In such a case, the display apparatus may have both a display function and an operational function. Examples of the mobile terminal include mobile phones such as smart-phones, tablet computers, and head-mounted displays.

Figure 13B:
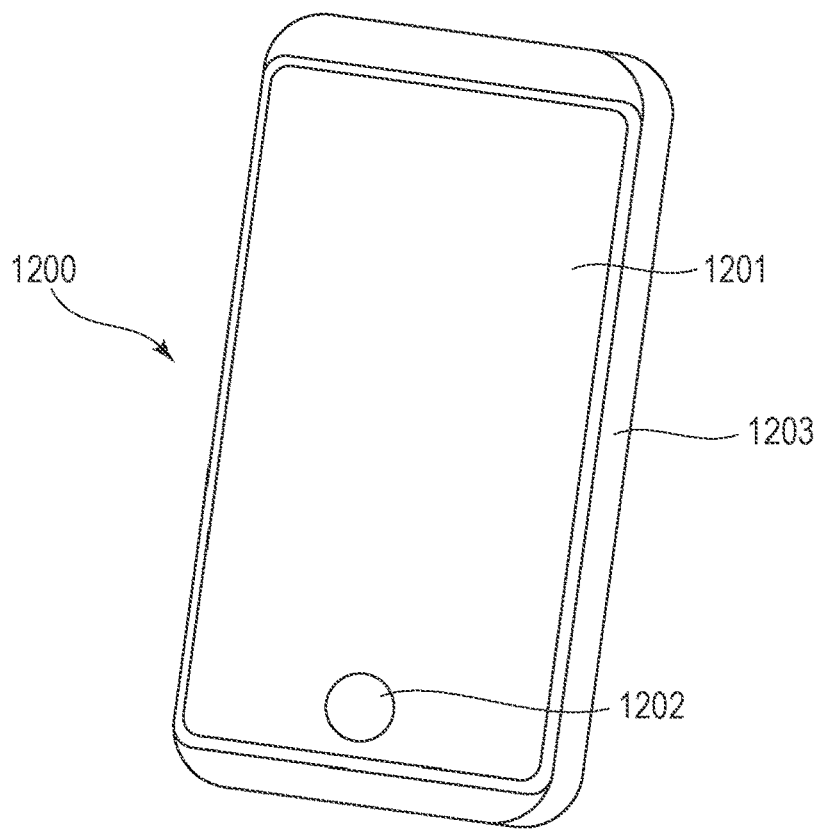
FIG. 13B is a schematic view illustrating an example of an electronic apparatus according to an embodiment.

FIG. 13B is a schematic view illustrating an example of an electronic apparatus according to the present embodiment. An electronic apparatus 1200 includes a display unit 1201, an operation unit 1202, and a housing 1203. The housing 1203 may include therein circuits, a printed board having the circuits, a battery, and a communication unit. The operation unit 1202 may be a button or a touch-panel response unit. The operation unit 1202 may be a biometric authentication unit configured to, for example, recognize the fingerprint and release the lock. An electronic apparatus including a communication unit may also be referred to as a communication apparatus.

Figure 14A:
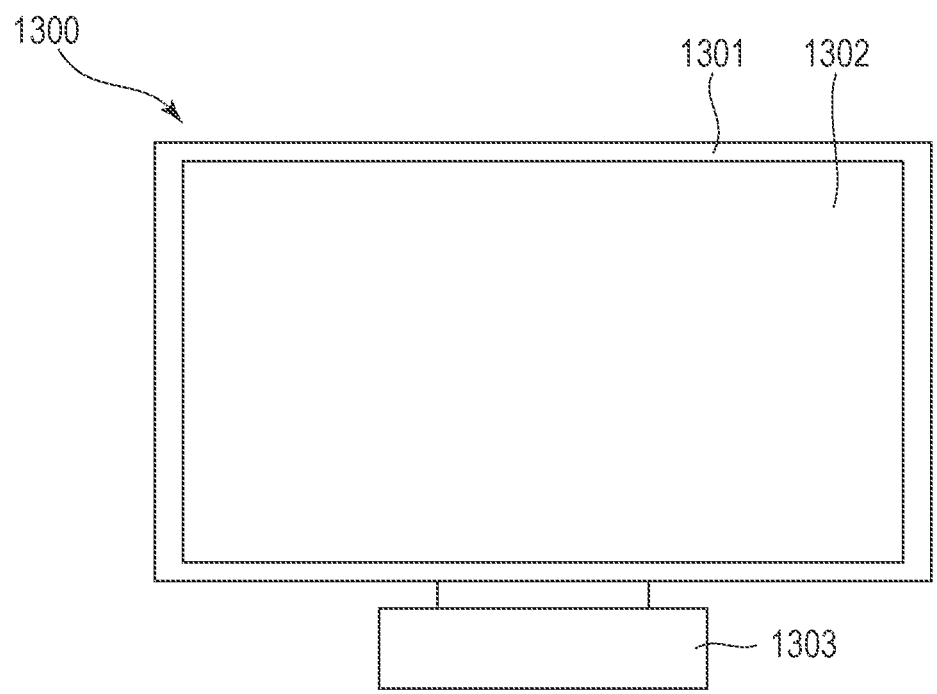
FIG. 14A is a schematic view illustrating an example of a display apparatus according to an embodiment.
Figure 14B:
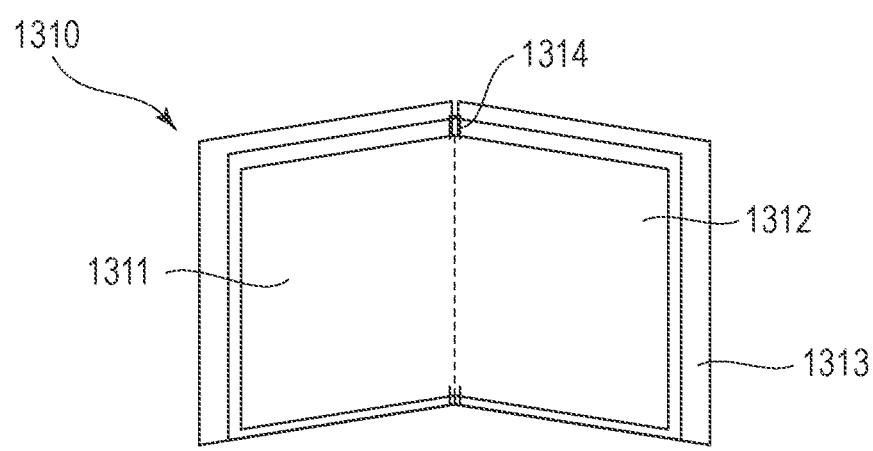
FIG. 14B is a schematic view illustrating an example of a foldable display apparatus.

FIG. 14A and FIG. 14B are schematic views each illustrating an example of a display apparatus according to the present embodiment. FIG. 14A illustrates a display apparatus such as a television monitor or a personal computer (PC) monitor display apparatus 1300 includes a frame 1301 and a display unit 1302. The light-emitting device according to the present embodiment may be used in the display unit 1302.

The display apparatus 1300 further includes a base 1303 that supports the frame 1301 and the display unit 1302. The base 1303 is not limited to the configuration illustrated in FIG. 14A. Alternatively, the lower side of the frame 1301 may also function as the base.

The frame 1301 and the display unit 1302 may be curved. The radius of curvature of the frame 1301 and the display unit 1302 may be 5,000 mm or more and 6,000 mm or less.

FIG. 14B is a schematic view illustrating another example of a display apparatus according to the present embodiment. A display apparatus 1310 illustrated in FIG. 14B is configured to be foldable and is a so-called foldable display apparatus. The display apparatus 1310 has a first display unit 1311, a second display unit 1312, a housing 1313, and a folding point 1314. Each of the first display unit 1311 and the second display unit 1312 may include the light-emitting device accordion to the present embodiment. The first display unit 1311 and the second display unit 1312 may be a single display apparatus without a joint. The first display unit 1311 and the second display unit 1312 can be separated from each other in the folding point 1314. The first display unit 1311 and the second display unit 1312 may display images that are different from each other. Alternatively, a single image may be displayed on a set of the first display unit 1311 and the second display unit 1312.

Figure 15A:
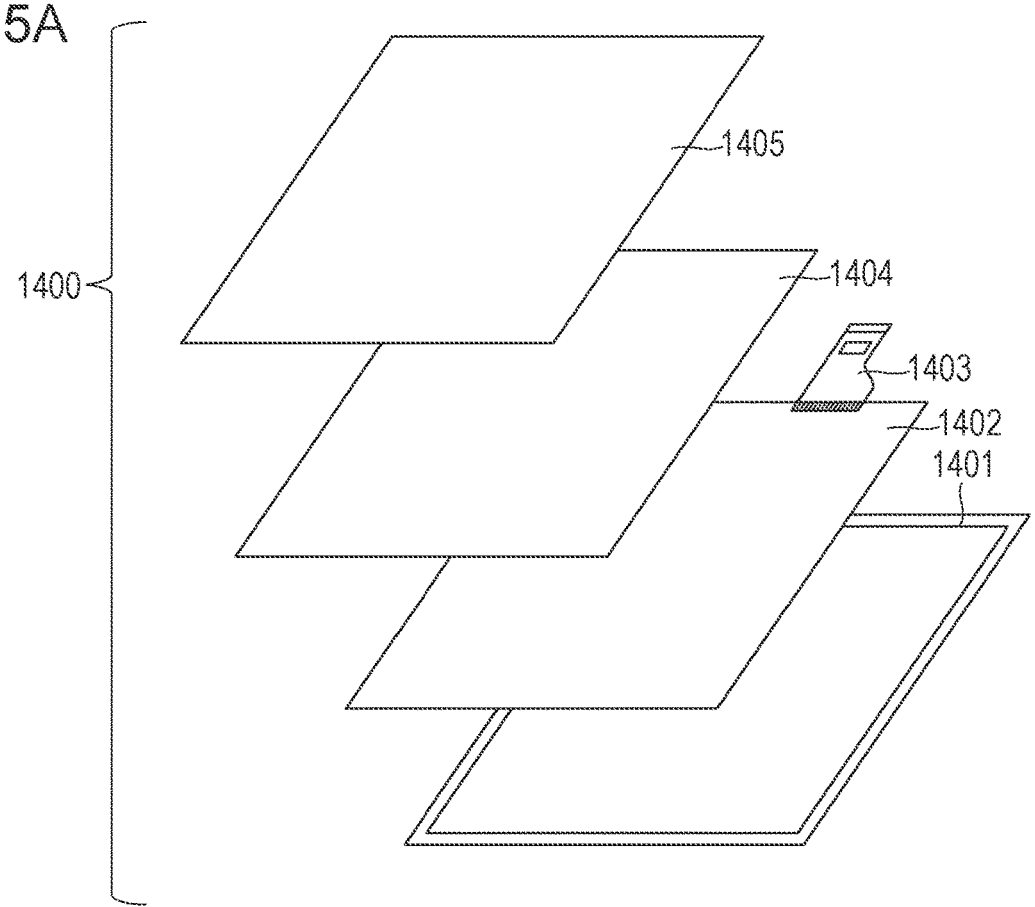
FIG. 15A is a schematic view illustrating an example of an illumination apparatus according to an embodiment.

FIG. 15A is a schematic view illustrating an example of an illumination apparatus according to the present embodiment. An illumination apparatus 1400 may include a housing 1401, a light source 1402, a circuit board 1403, an optical filter 1404, and a light diffusion unit 1405. The light source 1402 may include the organic light-emitting element according to the present embodiment. The optical filter 1404 may be a filter configured to improve the color rendering properties of the light source 1402. The light diffusion unit 1405 effectively diffuses light emitted from the light source 1402 and allows the light to reach a wide region, for example, for lighting up. The optical filter 1404 and the light diffusion unit 1405 may be disposed on the light emission side of the illumination apparatus 1400. A cover may be optionally disposed on an outermost portion.

The illumination apparatus is, for example, an apparatus that illuminates a room. The illumination apparatus may be configured to emit light of any color of white, neutral white, and other colors from blue to red. The illumination apparatus may include a light modulation circuit configured to modulate the light. The illumination apparatus may include the organic light-emitting element according to the present embodiment and a power supply circuit connected to the organic light-emitting element. The power supply circuit is a circuit configured to convert an alternating-current voltage to a direct-current voltage. The "white" corresponds to a color temperature of 4,200 K, and the "neutral white" corresponds to a color temperature of 5,000 K. The illumination apparatus may include a color filter.

The illumination apparatus according to the present embodiment may include a heat dissipation unit. The heat dissipation unit is configured to dissipate heat in the apparatus to the outside of the apparatus and may be made of, for example, a metal having a high specific heat or liquid silicon.

Figure 15B:
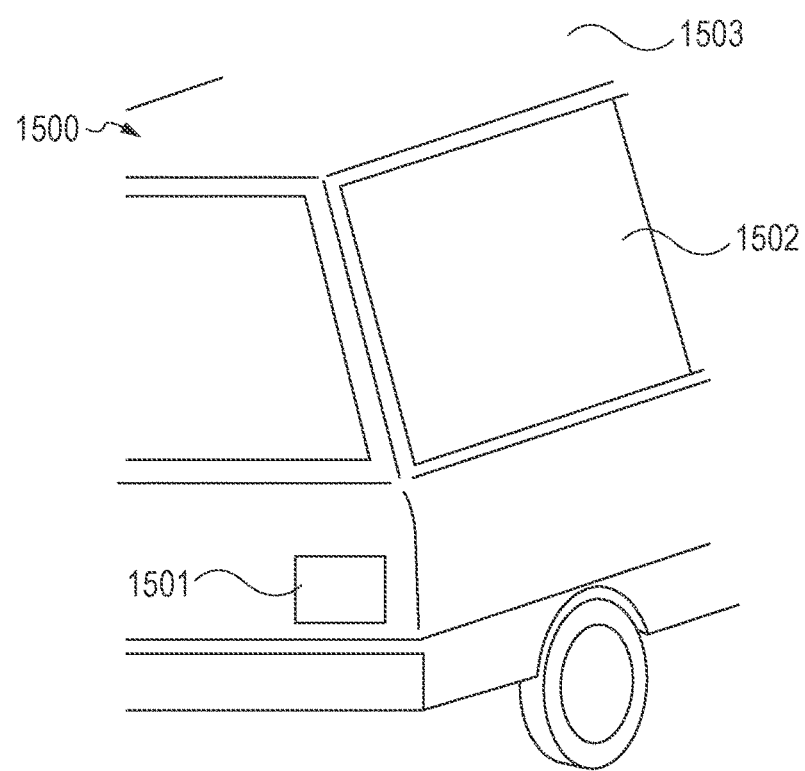
FIG. 15B is a schematic view illustrating an example of an automobile comprising a vehicle lighting fixture according to an embodiment.

FIG. 15B is a schematic view illustrating an automobile which is an example of a moving object according to the present embodiment. The automobile includes a tail lamp which is an example of a lighting fixture. An automobile 1500 includes a tail lamp 1501, and the tail lamp 1501 may be configured to light up when, for example, the brakes are applied.

The tail lamp 1501 may include the light-emitting element according to any of the first to fourth embodiments. The tail lamp 1501 may include a protective member configured to protect the light-emitting element. The protective member may be formed of any material as long as the strength of the protective member is high to a certain extent, and the protective member is transparent. The protective member may be formed of, for example, polycarbonate. The polycarbonate may be mixed with, for example, a furandicarboxylic acid derivative or an acrylonitrile derivative.

The automobile 1500 may include an automobile body 1503 and a window 1502 attached to the automobile body 1503. The window 1502 may be a transparent display unless it is a window for checking the front and rear of the automobile 1500. The transparent display may include the light-emitting device according to any of the first to fourth embodiments. In such a case, the members, such as electrodes, of the organic light-emitting element are formed of transparent members.

The moving object according to the present embodiment may be, for example, a ship, aircraft, or a drone. The moving object may include a body and a lighting fixture disposed on the body. The lighting fixture may emit light for notifying the position of the body. The lighting fixture includes the light-emitting device according to any of the first to fourth embodiments.

As described above, the use of the light-emitting device according to the embodiment enables an image having good image quality to be stably displayed for a long time.

EXAMPLES

Example 1

In this Example, a description will be made of the relationship between the thickness of a charge transport layer 41 and the leakage current between lower electrodes 2 of a light-emitting device 100 which is an example of a semiconductor device.

First, a metal layer was formed on an element substrate 1. Desired regions of the metal layer were then etched by using, for example, a mask pattern to thereby form lower electrodes 2. Subsequently, an insulating layer 3 was formed so as to cover the edges of the lower electrodes 2. In this Example, the insulating layer 3 was formed of silicon oxide and had a thickness of 90 nm as measured on the upper surface of each of the lower electrodes 2 in a direction perpendicular to the lower surface of the lower electrode 2.

After the insulating layer 3 was formed, desired regions of the insulating layer 3 were etched in two stages by using, for example, a mask pattern to thereby form openings 12. As illustrated in FIG. 3A, the resulting insulating layers 3 each had a shape having a steep slope portion 312, a steep slope portion 313, and a gentle slope portion 314. The steep slope portion 312 had a slope angle of 80°, the steep slope portion 313 had a slope angle of 80°, and the gentle slope portion 314 had a slope angle of 10°. The distance of the steep slope portion 312 in the height direction was 45 nm, and the distance of the steep slope portion 313 in the height direction was 45 nm. The distance of the gentle slope portion 314 in the horizontal direction was 200 nm. The slope angle of the insulating layer 3 along an edge portion of the lower electrode 2 was 40°.

In this Example, pixels were arranged in a delta array in which adjacent openings 12 had a distance of 1.4 μm therebetween, and adjacent lower electrodes 2 had a distance of 0.6 μm therebetween. As illustrated in FIG. 2, the pixels each had a hexagonal shape and were arranged in the delta array.

Subsequently, an organic layer 4 was formed. The organic layer 4 had a structure including, in the following order, a hole transport layer (a stack of a hole injection layer, a hole transport layer, and an electron blocking layer), a light-emitting layer having a two-layer structure, and an electron transport layer (a stack of an electron transport layer and an electron injection layer). First, the hole injection layer was formed by using a material represented by Compound 1 below on the element substrate 1 so as to have a thickness of 7 nm.

Compound 1

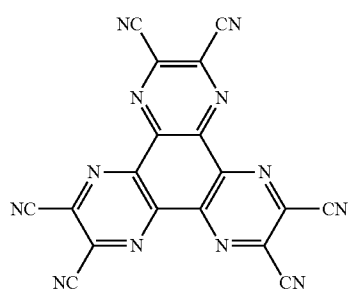

Subsequently, the hole transport layer was formed by using a material represented by Compound 2 below so as to have a thickness of 5 nm, and the electron blocking layer was formed by using a material represented by Compound 3 below so as to have a thickness of 10 nm. The light-emitting layer was formed so as to have a multilayer structure of two layers. First, as a first-layer light-emitting layer, a light-emitting layer including a host material represented by Compound 4 below and a light-emitting dopant represented by Compound 5 below was formed. The weight ratio of the light-emitting dopant was adjusted to 3%. The first-layer light-emitting layer was formed so as to have a layer thickness of 10 nm.

Compound 2

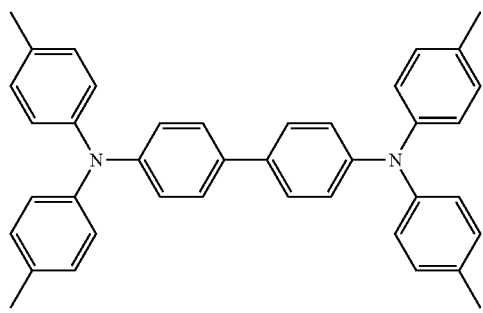

Compound 3

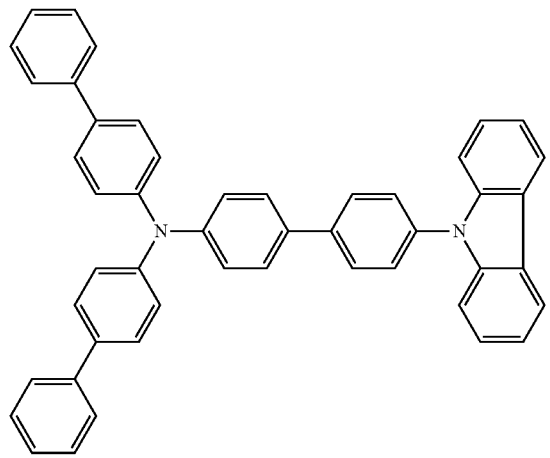

Compound 4

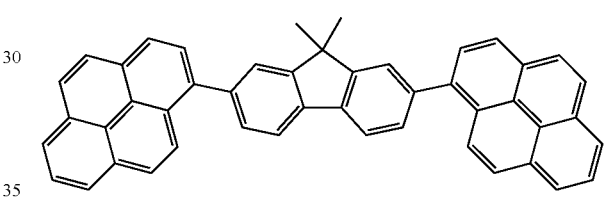

Compound 5

Next, as a second-layer light-emitting layer, a light-emitting layer including a host material represented by Compound 4 above and a light-emitting dopant represented by Compound 6 below was formed. The weight ratio of the light-emitting dopant was adjusted to 1%. The second-layer light-emitting layer was formed so as to have a layer thickness of 10 nm. After the light-emitting layer having the two-layer structure was formed, the electron transport layer was formed by using a material represented by Compound 7 so as to have a thickness of 34 nm, and the electron injection layer was further formed by using LiF so as to have a thickness of 0.5 nm.

Compound 6

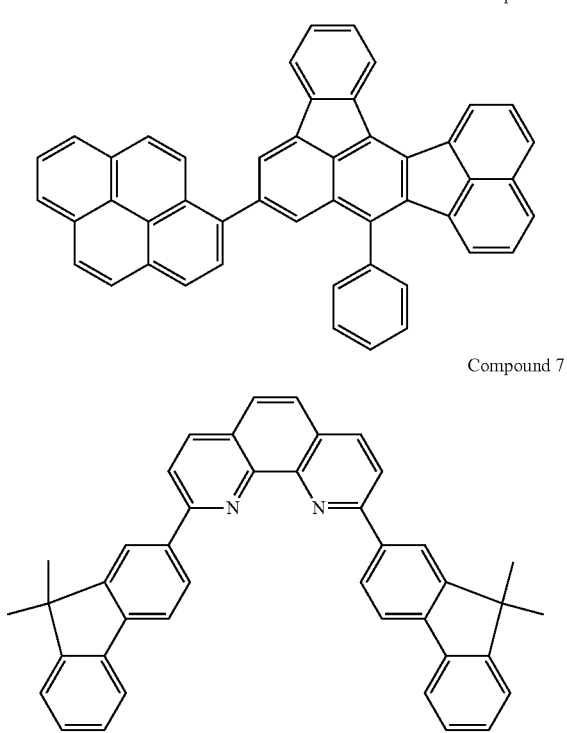

Compound 7

After the organic layer 4 was formed, an upper electrode 5 was formed by using a MgAg alloy having a ratio of Mg to Ag of 1:1 so as to have a thickness of 10 nm. After the upper electrode 5 was formed, a protective layer 6 was formed by using SiN by CVD so as to have a thickness of 1.5 μm. After the protective layer 6 was formed, color filters 7 were formed.

The ratio of the distance (1.4 μm) between edges of the insulating layers 3 disposed on two adjacent lower electrodes 2 to the thickness (76 nm, the total of the organic sublayers) of a portion of the organic layer 4, the portion being in contact with the lower electrodes 2, was 18, which was less than 50.

The thickness of a portion of the charge transport layer, the portion being in contact with the lower electrode 2. Which was the sum of the thicknesses of the hole injection layer, the hole transport layer, and the electron blocking layer, was 22 nm. The length of each of the steep slope portion 312 and the steep slope portion 313 in the direction perpendicular to the lower surface of the lower electrode 2 was 45 nm. Accordingly, the thickness of a portion of the charge transport layer, the portion being in contact with the lower electrode 2, was smaller than the length of each of the steep slope portion 312 and the steep slope portion 312 in the direction perpendicular to the lower surface of the lower electrode 2. Furthermore, a value that is 1.4 times the thickness of the charge transport layer was also smaller than the length (45 nm) of each of the steep slope portion 312 and the steep slope portion 313 in the perpendicular direction.

The thickness of a portion of the organic layer 4 in the perpendicular direction, the portion being in contact with the lower electrode 2, was 76 nm, which was higher than the length (45 nm) of each of the steep slope portion 312 and the steep slope portion 313 in the perpendicular direction.

In addition, the length (200 nm) of the gentle slope portion 314 in the direction parallel to the lower surface of the lower electrode 2 was larger than the length (45 nm) of the steep slope portion 313 in the perpendicular direction.

Among the peaks in the emission spectrum of the light-emitting layer, a peak at the shortest wavelength λ appeared at 460 nm, the optical distance L was 146 nm, and the phase shift φ was –π. Accordingly, Formula (9) below is satisfied.

$$(\lambda/8) \times (-(2\varphi/\pi)-1) < L < (\lambda/8) \times (-(2\varphi/\pi)+1) \quad (9)$$

Hereafter, characteristics of the light-emitting device 100 formed in this Example will be described. First, a method for measuring head/holed, which is an index relating to a leakage current between lower electrodes 2, will be described with reference to an R pixel as an example.

A current is allowed to flow through an R pixel while G pixels and B pixels adjacent to the R pixel are short-circuited (potential=0 V). In this case, a current flowing from the lower electrode of the R pixel to the upper electrode of the R pixel was denoted by $I_{oled}$, and the sum of currents flowing from the lower electrode of the R pixel to the upper electrodes of G pixels or B pixels was denoted by beak. Leak was measured at a potential where $I_{oled}$ was 0.1 nA/pixel. The ratio of $I_{leak}$ to $I_{oled}$ is expressed by $I_{leak}/I_{oled}$. When the ratio $I_{leak}/I_{oled}$ was 0.20 or less, it was evaluated that the leakage current was reduced.

Next, the leakage current between the upper electrode and the lower electrode will be described. The light-emitting elements have a light emission threshold voltage of about 2 V. Therefore, in a light-emitting element in which a leakage current does not flow between the upper electrode and the lower electrode, for example, even when a voltage of 1.5 V is applied between the upper electrode and the lower electrode, a current does not flow. In contrast, in a light-emitting element in which a leakage current flows between the upper electrode and the lower electrode, when a voltage of 1.5 V is applied between the upper electrode and the lower electrode, a current flows.

In view of the above, a current value was measured when a voltage of 1.5 V was applied between the upper electrode and the lower electrode of the R pixel. Specifically, the current flowing when a voltage of 1.5 V is applied is a leakage current in a light-emitting element in which a reduction in the leakage current between the upper electrode and the lower electrode is achieved, a current does not flow even when a voltage of 1.5 V is applied.

According to the results, the ratio $I_{leak}/I_{oled}$ was 0.15, and the amount of current flowing when a voltage of 1.5 V was applied was lower than the limit of measurement ($1 \times 10^{-6}$ nA/pixel).

Comparative Example 1

A light-emitting device was produced as in Example 1 except that the insulating layer had a single steep slope portion and had no gentle slope portion, as illustrated in FIG. 3C. The length of the steep slope portion in the perpendicular direction is 90 nm, which is the same as the sum of the lengths of the steep slope portion 312 and the steep slope portion 313 of Example 1 in the perpendicular direction.

As a result, an excessively large leakage current flowed between the upper electrode and the lower electrode, and an accurate value of $I_{leak}/I_{oled}$ could not be measured. Specifically, Leak was large and Lied was small, and thus the ratio $I_{leak}/I_{oled}$ was a very large value and could not be measured. The amount of current flowing when a voltage of 1.5 V was applied was very large, namely, $1 \times 10^{-1}$ nA/pixel.

These results show the following. When a leakage current between the lower electrodes is intended to be reduced by providing a single steep slope portion and increasing the distance of the steep slope portion in the height direction, a leakage current between the upper electrode and the lower electrode increases.

Comparative Example 2

A light-emitting device was produced as in Example 1 except that the insulating layer had a single steep slope portion and had no gentle slope portion, and the steep slope portion had a length of 45 nm in the perpendicular direction, as illustrated in FIG. 3C. The length of the insulating layer of this Comparative Example in the perpendicular direction is the same as the length of each of the steep slope portion 312 and the steep slope portion 313 of Example 1 in the perpendicular direction.

As a result, although the amount of current flowing when a voltage of 1.5 V was applied was good, namely, lower than the limit of measurement ($1\times10^{-6}$ nA/pixel), the ratio $I_{leak}/I_{oled}$ was 0.3.

These results show the following. When a single steep slope portion is provided and the distance of the steep slope portion in the height direction is decreased, a leakage current between the upper electrode and the lower electrode can be reduced, but a leakage current between the lower electrodes increases.

Comparative Example 3

The light-emitting device of Comparative Example 1 was used as Sample A. In the light-emitting device of Sample A, a charge transport layer 41 is formed along the steep slope portion 316, as illustrated in FIG. 3C. Layer thicknesses of the charge transport layer in the direction perpendicular to the steep slope portion 316 were measured on the basis of a sectional TEM image at heights of, from the lower electrode 2, 1.1 times, 1.2 times, 1.3 times, 1.4 times, 1.5 times, and 1.6 times the thickness of the charge transport layer on the lower electrode 2 in the perpendicular direction.

A light-emitting device in which the slope angle of the steep slope portion 316 of Sample A was changed to 50° was produced as Sample B. A light-emitting device in which the thickness of the hole transport layer of Sample A was changed to 20 nm was produced as Sample C. The layer thicknesses were measured on the basis of sectional TEM images as in Sample A. Table 1 shows the results.

The results show the following. In all the samples, the charge transport layer has the smallest thickness in the direction perpendicular to the steep slope portion 316 at heights of 1.4 times or more the thickness of a portion of the charge transport layer in the perpendicular direction, the portion being in contact with the lower electrode 2. Accordingly, the results suggest the following. When the length of the steep slope portion 312 in the direction perpendicular to the lower surface of the lower electrode is 1.4 times or more the thickness of the charge transport layer in the direction perpendicular to the lower surface of the lower electrode, a thin charge transport layer can be formed along the steep slope portion 312. Similarly, when the length of the steep slope portion 313 in the direction perpendicular to the lower surface of the lower electrode is 1.4 times or more the thickness of the charge transport layer in the direction perpendicular to the lower surface of the lower electrode, a thin charge transport layer can be formed along the steep slope portion 313.

TABLE 1

|  | 1.1 Times | 1.2 Times | 1.3 Times | 1.4 Times | 1.5 Times | 1.6 Times |
|---|---|---|---|---|---|---|
| Sample A | 9 nm | 8 nm | 7 nm | 6 nm | 6 nm | 6 nm |
| Sample B | 21 nm | 19 nm | 17 nm | 15 nm | 15 nm | 15 nm |
| Sample C | 15 nm | 13 nm | 12 nm | 10 nm | 10 nm | 10 nm |

Some embodiments of the present disclosure provide a semiconductor device in which a leakage current between lower electrodes is reduced.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-158970, filed on Aug. 30, 2019, which is hereby incorporated by reference herein in its entirety.

What is claimed is:

1. A semiconductor device comprising:
a first electrode disposed on a substrate;
an insulating layer covering an edge of the first electrode and disposed on the substrate;
an organic layer that comprises a charge transport layer disposed on the first electrode and the insulating layer and a functional layer disposed on the charge transport layer; and
a second electrode disposed on the organic layer,
wherein, in a section passing through the substrate, the insulating layer, and the organic layer, the insulating layer has
a first portion having a surface that forms an angle of 0° or more and 50° or less with respect to a parallel surface parallel to a lower surface of the first electrode,
a second portion located closer to the substrate than the first portion and having a surface that slopes at an angle of more than 50° with respect to the parallel surface, and
a third portion located farther away from the substrate than the first portion and having a surface that slopes at an angle of more than 50° with respect to the parallel surface,
in the section, a length of the third portion in a direction perpendicular to the parallel surface is larger than a thickness of the charge transport layer at a position at which the first electrode and the charge transport layer are in contact with each other in the section,
in the section,
a thickness of the organic layer at a position at which the first electrode and the organic layer are in contact with each other is larger than the length of the third portion in the direction perpendicular to the parallel surface, and
the charge transport layer is in contact with the first electrode, the function layer, and the insulating layer.

2. The semiconductor device according to claim 1, wherein, in the section, a length of the second portion in the direction perpendicular to the parallel surface is larger than the thickness of the charge transport layer.

3. The semiconductor device according to claim 1, wherein, in the section, a thickness of the organic layer at a position at which the first electrode and the organic layer are in contact with each other in the section is larger than the length of the second portion in the direction perpendicular to the parallel surface.

4. The semiconductor device according to claim 1, wherein the surface of the second portion slopes at 90° or less with respect to the parallel surface.

5. The semiconductor device according to claim 1, wherein the surface of the third portion slopes at 90° or less with respect to the parallel surface.

6. The semiconductor device according to claim 1, wherein, in the section, the length of the second portion in the direction perpendicular to the parallel surface is larger than 1.4 times the thickness of the charge transport layer, and
in the section, the length of the third portion in the direction perpendicular to the parallel surface is larger than 1.4 times the thickness of the charge transport layer.

7. The semiconductor device according to claim 1, wherein, in the section, a length of the surface of the first portion in a direction parallel to the parallel surface is larger than the length of the third portion in the direction perpendicular to the parallel surface.

8. The semiconductor device according to claim 1, wherein, in the section, the length of the surface of the first portion in the direction parallel to the parallel surface is larger than the length of the second portion in the direction perpendicular to the parallel surface and is larger than the length of the third portion in the direction perpendicular to the parallel surface.

9. The semiconductor device according to claim 1, further comprising:
a third electrode disposed on the substrate,
wherein the insulating layer covers an edge of the third electrode,
the second electrode is disposed on the third electrode with the organic layer therebetween,
in the section, the insulating layer has an edge portion in contact with the third electrode, and
when, in the section, a thickness of the organic layer at a position at which the first electrode and the organic layer are in contact with each other in the section is denoted by C and a distance from an edge of the insulating layer located on the first electrode to an edge of the insulating layer located on the third electrode is denoted by D,
a ratio D/C of the distance D to the thickness C is less than 50.

10. The semiconductor device according to claim 1, wherein the first portion, the second portion, and the third portion overlap the first electrode in plan view with respect to the lower surface of the first electrode.

11. The semiconductor device according to claim 1, wherein the thickness of the organic layer at a position at which the first electrode and the organic layer are in contact with each other in the section is smaller than a sum of the lengths of the first portion, the second portion, and the third portion in the direction perpendicular to the parallel surface.

12. The semiconductor device according to claim 1, further comprising:
a second insulating layer disposed between the substrate and the first electrode,
wherein the insulating layer covers an edge portion of the second insulating layer.

13. The semiconductor device according to claim 1, further comprising:
a reflective layer disposed on the substrate; and
a second insulating layer disposed between the reflective layer and the first electrode,
wherein, in the section, the first portion and the second portion of the insulating layer cover an edge portion of the second insulating layer, and
in the section, the third portion of the insulating layer is located on the second insulating layer.

14. The semiconductor device according to claim 13, further comprising:
a fourth electrode disposed in contact with the substrate,
wherein the insulating layer covers an edge portion of the fourth electrode,
the second electrode is disposed on the fourth electrode with the organic layer therebetween, and
in plan view with respect to the lower surface of the first electrode, the first portion, the second portion, and the third portion of the insulating layer are located between the first electrode and the fourth electrode.

15. The semiconductor device according to claim 1, wherein, in the section, the insulating layer has
a fourth portion having a surface that slopes at 45° or more and 90° or less with respect to the parallel surface,
a fifth portion located closer to the substrate than the fourth portion and having a surface that slopes at more than 0° and less than 45° with respect to the parallel surface, and
a sixth portion located closer to the organic layer than the fourth portion and having a surface that slopes at more than 0° and less than 45° with respect to the parallel surface, and
a length of the fifth portion in the direction perpendicular to the parallel surface is larger than a length of the sixth portion in the direction perpendicular to the parallel surface.

16. The semiconductor device according to claim 1, wherein the functional layer comprises a light-emitting layer.

17. The semiconductor device according to claim 16, wherein an optical distance L between the first electrode and the second electrode satisfies a formula below:

$$(\lambda/8) \times (-(2\varphi/\pi)-1) < L < (\lambda/8) \times (-(2\varphi/\pi)+1)$$

where $\lambda$ represents a wavelength of a maximum peak in an emission spectrum of light emitted from the light-emitting layer, and $\varphi$ represents a phase shift at the first electrode.

18. A display apparatus comprising the semiconductor device according to claim 1,
wherein the display apparatus comprises a plurality of pixels, and
at least one of the plurality of pixels comprises a light-emitting element comprising the first electrode, the organic layer, and the second electrode and a transistor connected to the light-emitting element.

19. An imaging apparatus comprising:
an optical unit comprising a plurality of lenses;
an imaging element that receives light which has passed through the optical unit; and
a display unit that displays an image captured by the imaging element,
wherein the display unit comprises the semiconductor device according to claim 1.

20. An electronic apparatus comprising:
a display unit comprising the semiconductor device according to claim 1;
a housing provided with the display unit; and
a communication unit that is disposed in the housing and that communicates with an external unit.

21. An illumination apparatus comprising:
a light source comprising the semiconductor device according to claim 1; and
a light diffusion unit or an optical filter that transmits light emitted from the light source.

22. A moving object comprising:
a lighting fixture comprising the semiconductor device according to claim 1; and
a body provided with the lighting fixture.

23. A photoelectric conversion apparatus comprising:
an optical unit comprising a plurality of lenses; and
an imaging unit that receives light which has passed through the optical unit,
wherein the imaging unit comprises the semiconductor device according to claim 1.

24. A semiconductor device comprising:
a first electrode disposed on a substrate;
an insulating layer covering an edge of the first electrode and disposed on the substrate;
an organic layer that comprises a charge transport layer disposed on the first electrode and the insulating layer and a functional layer disposed on the charge transport layer;
a second electrode disposed on the organic layer; and
a third electrode disposed on the substrate,
wherein, in a section passing through the substrate, the insulating layer, and the organic layer, the insulating layer has
a first portion having a surface that forms an angle of 0° or more and 50° or less with respect to a parallel surface parallel to a lower surface of the first electrode,
a second portion located closer to the substrate than the first portion and having a surface that slopes at an angle of more than 50° with respect to the parallel surface, and
a third portion located farther away from the substrate than the first portion and having a surface that slopes at an angle of more than 50° with respect to the parallel surface,
the insulating layer covers an edge of the third electrode,
the second electrode is disposed on the third electrode with the organic layer therebetween,
in the section, a length of the third portion in a direction perpendicular to the parallel surface is larger than a thickness of the charge transport layer at a position at which the first electrode and the charge transport layer are in contact with each other,
in the section,
the charge transport layer is in contact with the first electrode, the function layer, and the insulating layer,
when a thickness of the organic layer at a position at which the first electrode and the organic layer are in contact with each other is denoted by C and a distance from an edge of the insulating layer located on the first electrode to an edge of the insulating layer located on the third electrode is denoted by D, and
a ratio D/C of the distance D to the thickness C is less than 50.

25. The semiconductor device according to claim 24, further comprising:
a reflective layer disposed on the substrate; and
a second insulating layer disposed between the reflective layer and the first electrode,
wherein, in the cross section, the first portion and the second portion of the insulating layer cover an edge portion of the second insulating layer, and
in the section, the third portion of the insulating layer is located on the second insulating layer.

26. The semiconductor device according to claim 24, wherein the functional layer comprises a light-emitting layer.

27. The semiconductor device according to claim 24, wherein an optical distance L between the first electrode and the second electrode satisfies a formula below:

$$(\lambda/8) \times (-(2\varphi/\pi)-1) < L < (\lambda/8) \times (-(2\varphi/\pi)+1)$$

where $\lambda$ represents a wavelength of a maximum peak in an emission spectrum of light emitted from the light-emitting layer, and $\varphi$ represents a phase shift at the first electrode.

28. A semiconductor device comprising:
a first electrode disposed on a substrate;
an insulating layer covering an edge of the first electrode and disposed on the substrate;
an organic layer that comprises a charge transport layer disposed on the first electrode and the insulating layer and a functional layer disposed on the charge transport layer;
a second electrode disposed on the organic layer;
a reflective layer disposed on the substrate; and
a second insulating layer disposed between the reflective layer and the first electrode,
wherein, in a section passing through the substrate, the insulating layer, and the organic layer, the insulating layer has
a first portion having a surface that forms an angle of 0° or more and 50° or less with respect to a parallel surface parallel to a lower surface of the first electrode,
a second portion located closer to the substrate than the first portion and having a surface that slopes at an angle of more than 50° with respect to the parallel surface, and
a third portion located farther away from the substrate than the first portion and having a surface that slopes at an angle of more than 50° with respect to the parallel surface, and
in the section,
a length of the third portion in a direction perpendicular to the parallel surface is larger than a thickness of the charge transport layer at a position at which the first electrode and the charge transport layer are in contact with each other,
the charge transport layer is in contact with the first electrode, the function layer, and the insulating layer,
the first portion and the second portion of the insulating layer cover an edge portion of the second insulating layer, and
the third portion of the insulating layer is located on the second insulating layer.

29. The semiconductor device according to claim 28, wherein the functional layer comprises a light-emitting layer.

30. The semiconductor device according to claim 28, wherein an optical distance L between the first electrode and the second electrode satisfies a formula below:

$$(\lambda/8)\times(-(2\varphi/\pi)-1) < L < (\lambda/8)\times(-(2\varphi/\pi)+1)$$

where $\lambda$ represents a wavelength of a maximum peak in an emission spectrum of light emitted from the light-emitting layer, and $\varphi$ represents a phase shift at the first electrode.

* * * * *